(12) United States Patent
Yamazaki et al.

(10) Patent No.: US 8,890,127 B2
(45) Date of Patent: Nov. 18, 2014

(54) LIGHT-EMITTING MODULE AND LIGHT-EMITTING DEVICE

(71) Applicant: Semiconductor Energy Laboratory Co., Ltd., Kanagawa-ken (JP)

(72) Inventors: Shunpei Yamazaki, Tokyo (JP); Yoshiharu Hirakata, Kanagawa (JP); Takashi Hamada, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 199 days.

(21) Appl. No.: 13/664,864

(22) Filed: Oct. 31, 2012

(65) Prior Publication Data
US 2013/0112955 A1    May 9, 2013

(30) Foreign Application Priority Data
Nov. 4, 2011   (JP) .................. 2011-242293

(51) Int. Cl.
*H01L 35/24*   (2006.01)
(52) U.S. Cl.
USPC .................. 257/40; 257/E51.001
(58) Field of Classification Search
USPC ............................ 257/40, E51.001
See application file for complete search history.

(56) References Cited

U.S. PATENT DOCUMENTS

| | | | |
|---|---|---|---|
| 7,365,487 B2 | 4/2008 | Matsuura et al. |
| 7,399,991 B2 | 7/2008 | Seo et al. |
| 7,663,149 B2 | 2/2010 | Seo et al. |
| 2012/0161167 A1 | 6/2012 | Yamazaki |
| 2012/0205678 A1 | 8/2012 | Ikeda et al. |
| 2012/0205700 A1 | 8/2012 | Tanada et al. |

FOREIGN PATENT DOCUMENTS

| | | |
|---|---|---|
| JP | 2002-324673 | 11/2002 |
| JP | 2005-268062 | 9/2005 |

*Primary Examiner* — Anthony Ho
(74) *Attorney, Agent, or Firm* — Husch Blackwell LLP

(57) ABSTRACT

Provided is a light-emitting module from which light with uniform brightness can be extracted. Further, provided is a beautiful light-emitting module in which Newton's rings are not observed. The light-emitting module includes a first substrate, a light-emitting element formed on one surface side of the first substrate, a second substrate, a conductive spacer maintaining the gap between the first substrate and the second substrate, and a space in which the light-emitting element is sealed between the first substrate and the second substrate. Further, the pressure in the space is lower than or equal to the atmospheric pressure. Furthermore, the conductive spacer is electrically connected to the second electrode in a position overlapping with a partition provided over the first substrate so as to reduce a voltage drop occurring in the second electrode.

20 Claims, 8 Drawing Sheets

LIGHT-EMITTING MODULE AND LIGHT-EMITTING DEVICE

BACKGROUND OF THE INVENTION

1. Field of the Invention

The present invention relates to a light-emitting module including a light-emitting element in a sealed space, and to a light-emitting device including the light-emitting module.

2. Description of the Related Art

In a known light-emitting element, a layer containing a light-emitting organic compound (also referred to as an EL layer) and having a planar shape is provided between a pair of electrodes. Such a light-emitting element is called, for example, an organic EL element, and light emission can be obtained from the light-emitting organic compound when voltage is applied between the pair of electrodes. Further, light-emitting devices such as a lighting device and a display device including an organic EL element are known. Patent Document 1 discloses an example of a display device including an organic EL element.

REFERENCE

Patent Document

[Patent Document 1] Japanese Published Patent Application No. 2002-324673

SUMMARY OF THE INVENTION

In a light-emitting module including a light-emitting element in which a layer containing a light-emitting organic compound is interposed between a pair of electrodes, in a case where a decrease in luminance, which results from a voltage drop due to the electric resistance (possibly also referred to as sheet resistance) of one of the electrodes, is so large as to be recognized by an observer, it may be difficult to extract uniform planar light emission from the light-emitting module. Accordingly, the brightness of a surface from which light emission is extracted may be uneven (or luminance distribution may fail).

In a light-emitting module including a light-emitting element sealed between a first substrate over one surface of which the light-emitting element is provided and a second substrate that transmits light emitted from the light-emitting element, when the gap between the first substrate and the second substrate is uneven, Newton's rings, particularly uneven patterns of Newton's rings, are observed, causing disfigurement.

One embodiment of the present invention is made in view of the foregoing technical background. Thus, an object is to provide a light-emitting module from which light with uniform brightness can be extracted. Another object is to provide a beautiful light-emitting module in which Newton's rings are not observed.

Further object is to provide a light-emitting device from which light with uniform brightness can be extracted. Still further object is to provide a beautiful light-emitting device in which Newton's rings are not observed.

To achieve any of the above objects, one embodiment of the present invention focuses on an auxiliary electrode that decreases the electric resistance (possibly also referred to as sheet resistance) of one of electrodes of a light-emitting element that includes a layer containing a light-emitting organic compound between a pair of electrodes. One embodiment of the present invention also focuses on a spacer that adjusts the gap between a first substrate and a second substrate that seal the light-emitting element therebetween. Further, one embodiment of the present invention has arrived at an idea of a light-emitting module having a structure described below, which solves the above problem.

A light-emitting module according to one embodiment of the present invention includes a first substrate, a light-emitting element formed on one surface side of the first substrate, a second substrate, a conductive spacer maintaining the gap between the first substrate and the second substrate, and a space in which the light-emitting element is sealed between the first substrate and the second substrate. Note that a first electrode, a partition having an opening over the first electrode, a second electrode over the first electrode, and a layer containing a light-emitting organic compound between the first electrode and the second electrode are provided over the first substrate. The light-emitting element includes, in a position overlapping with the opening of the partition, the first electrode, the second electrode, and the layer containing a light-emitting organic compound between the first electrode and the second electrode. The second electrode is a metal thin film formed by an evaporation method with such a small thickness as to transmit light emitted from the layer containing a light-emitting organic compound. In a position overlapping with the light-emitting element, a region transmitting light emitted from the light-emitting element is provided over the second substrate. Further, the pressure in the space is lower than or equal to the atmospheric pressure. Furthermore, the conductive spacer is electrically connected to the second electrode in a position overlapping with the partition and is provided over a second substrate so as to reduce a voltage drop occurring in the second electrode. Note that the light emitted from the layer containing a light-emitting organic compound is extracted from the second substrate side through the second electrode formed using the metal thin film.

That is, a light-emitting module according to one embodiment of the present invention includes a first substrate, a light-emitting element formed on one surface side of the first substrate, a second substrate provided on the one surface side of the first substrate, a conductive spacer maintaining the gap between the first substrate and the second substrate, and a space in which the light-emitting element is sealed between the first substrate and the second substrate. Note that a first electrode and a partition having an opening over the first electrode, a second electrode over the first electrode, and a layer containing a light-emitting organic compound between the first electrode and the second electrode are provided over the first substrate. The light-emitting element includes, in a position overlapping with the opening of the partition, the first electrode, the second electrode, and the layer containing a light-emitting organic compound between the first electrode and the second electrode. The second electrode is a metal thin film formed by an evaporation method with such a small thickness as to transmit light emitted from the layer containing a light-emitting organic compound. In a position overlapping with the light-emitting element, a region transmitting light emitted from the light-emitting element is provided over the second substrate. Further, the pressure in the space is lower than or equal to the atmospheric pressure. Furthermore, the conductive spacer is electrically connected to the second electrode in a position overlapping with the partition and is provided over a second substrate so as to reduce a voltage drop occurring in the second electrode.

In the above light-emitting module according to one embodiment of the present invention, the conductive spacer provided over the second substrate is electrically connected, over the partition, to the second electrode of the light-emitting element which is provided over the first substrate, resulting in a reduction in voltage drop occurring in the second electrode. Accordingly, a light-emitting module from which light with uniform brightness is extracted can be provided. Further, a beautiful light-emitting module in which Newton's rings are not observed can be provided.

Another embodiment of the present invention is the above light-emitting module in which the light-emitting element includes a first layer containing a light-emitting organic compound, a second layer containing a light-emitting organic compound, and an intermediate layer provided between the first layer containing a light-emitting organic compound and the second layer containing a light-emitting organic compound. Further, the intermediate layer contains an electron-transport substance and a donor substance. The conductive spacer has an edge in which a corner portion is chamfered to have a curved surface, and the edge is electrically connected to the second electrode.

The light-emitting module according to one embodiment of the present invention includes a light-emitting element including a first layer containing a light-emitting organic compound, a second layer containing a light-emitting organic compound, and an intermediate layer provided between the first layer containing a light-emitting organic compound and the second layer containing a light-emitting organic compound. Further, the conductive spacer has an edge in which a corner portion is chamfered to have a curved surface, and the edge is in contact with the second electrode of the light-emitting element over the partition. The voltage drop is reduced in the second electrode electrically connected to the conductive spacer. In particular, since the corner portion of the edge of the conductive spacer is chamfered to have a curved surface, stress to be applied from the conductive spacer to the first layer containing a light-emitting organic compound, the second layer containing a light-emitting organic compound, the intermediate layer, and the second electrode can be dispersed.

Note that each of the first layer containing a light-emitting organic compound, the second layer containing a light-emitting organic compound, and the intermediate layer is likely to be damaged. The damage might cause abnormal light-emission of the light-emitting element.

As an example, in a case where the stress from the edge of the conductive spacer concentrates on the second electrode and the second layer containing a light-emitting organic compound, thereby damaging these layers, the conductive spacer and the intermediate layer might be short-circuited. This might keep current from flowing in the second layer containing a light-emitting organic compound. As a result, light emission from the second layer containing a light-emitting organic compound might be attenuated or quenched.

However, according to one embodiment of the present invention, the stress applied from the conductive spacer to the layers over the partition can be dispersed; thus, the above malfunction can be prevented. Accordingly, a light-emitting module from which light with uniform brightness is extracted can be provided. Further, a beautiful light-emitting module in which Newton's rings are not observed can be provided.

Further, a light-emitting module according to another embodiment of the present invention includes a first substrate, a light-emitting element formed on one surface side of the first substrate, a second substrate provided on the one surface side of the first substrate, a conductive spacer maintaining the gap between the first substrate and the second substrate, and a space in which the light-emitting element is sealed between the first substrate and the second substrate. Note that a first electrode and a partition having an opening over the first electrode, a second electrode over the first electrode, and a layer containing a light-emitting organic compound between the first electrode and the second electrode are provided over the first substrate. The light-emitting element includes, in a position overlapping with the opening of the partition, the first electrode, the second electrode, and the layer containing a light-emitting organic compound between the first electrode and the second electrode. The second electrode is a metal thin film formed by an evaporation method with such a small thickness as to transmit light emitted from the layer containing a light-emitting organic compound. In a position overlapping with the light-emitting element, a region transmitting light emitted from the light-emitting element is provided over the second substrate. Further, the pressure in the space is lower than or equal to the atmospheric pressure. Furthermore, the conductive spacer is electrically connected to the second electrode in a position overlapping with the partition and is provided over a first substrate so as to reduce a voltage drop occurring in the second electrode.

In the above light-emitting module according to one embodiment of the present invention, the conductive spacer provided over the first substrate is electrically connected to the second electrode of the light-emitting element which is provided over the first substrate, resulting in a reduction in voltage drop occurring in the second electrode. Accordingly, a light-emitting module from which light with uniform brightness is extracted can be provided. Further, a beautiful light-emitting module in which Newton's rings are not observed can be provided.

Another embodiment of the present invention is the above light-emitting module in which the conductive spacer includes a plurality of layers in which a layer with lower reflectance than another layer is provided on the second substrate side.

In the above light-emitting module according to one embodiment of the present invention, the conductive spacer includes the layer with lower reflectance than another layer, which is provided on the second substrate side. The layer with lower reflectance absorbs part of outside light that enters the conductive spacer from the second substrate side and part of outside light that is reflected by the other layer(s) included in the conductive spacer. As a result, a light-emitting module in which the reflection of the outside light is suppressed and from which light with uniform brightness is extracted can be provided. Further, a beautiful light-emitting module in which the reflection of the outside light is suppressed and Newton's rings are not observed can be provided.

Another embodiment of the present invention is the above light-emitting module including a color filter extending between the second substrate and the conductive spacer.

The above light-emitting module according to one embodiment of the present invention includes a color filter extending between the second substrate and the conductive spacer. The color filter absorbs part of the outside light that enters the conductive spacer from the second substrate side and part of the outside light that is reflected by the conductive spacer. As a result, a light-emitting module in which the reflection of the outside light is suppressed and from which light with uniform brightness is extracted can be provided. Further, a beautiful light-emitting module in which the reflection of the outside light is suppressed and Newton's rings are not observed can be provided.

Another embodiment of the present invention is a light-emitting device including any of the above light-emitting modules.

In the above light-emitting device according to one embodiment of the present invention, the conductive spacer provided over the first substrate or the second substrate is electrically connected to the second electrode of the light-emitting element which is provided over the first substrate, resulting in a reduction in voltage drop occurring in the second electrode. Accordingly, a light-emitting device from which light with uniform brightness is extracted can be provided. Further, a beautiful light-emitting device in which Newton's rings are not observed can be provided.

Note that in this specification, an "EL layer" refers to a layer provided between a pair of electrodes in a light-emitting element. Thus, a light-emitting layer containing an organic compound that is a light-emitting substance which is interposed between electrodes is one embodiment of the EL layer.

In this specification, in a case where a substance A is dispersed in a matrix formed using a substance B, the substance B forming the matrix is referred to as a host material, and the substance A dispersed in the matrix is referred to as a guest material. Note that the substance A and the substance B may each be a single substance or a mixture of two or more types of substances.

Note that a light-emitting device in this specification means an image display device, a light-emitting device, or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted over a substrate over which a light-emitting element is formed by a chip on glass (COG) method.

According to one embodiment of the present invention, a light-emitting module from which light with uniform brightness is extracted can be provided. Further, a beautiful light-emitting module in which Newton's rings are not observed can be provided.

Further, a light-emitting device from which light with uniform brightness is extracted can be provided. Further, a beautiful light-emitting device in which Newton's rings are not observed can be provided.

DETAILED DESCRIPTION OF THE INVENTION

Figure 1A:
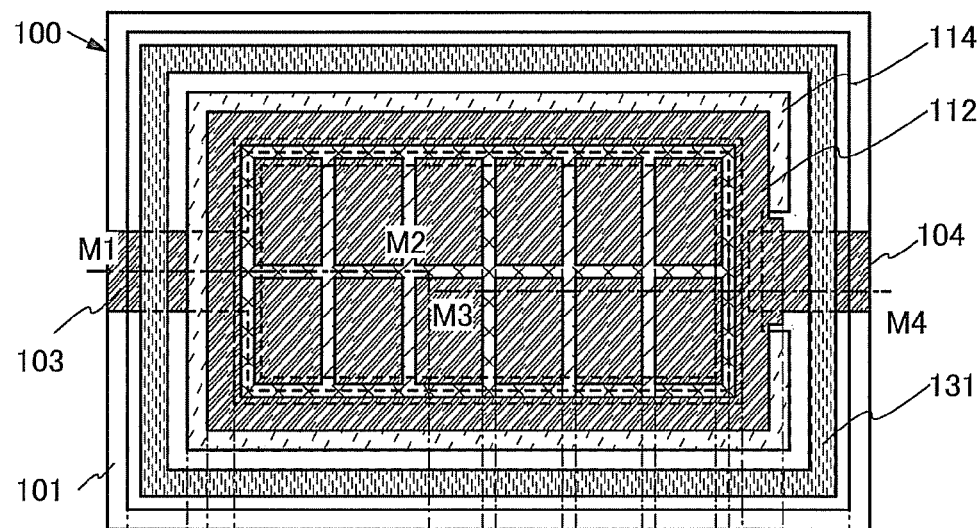
FIGS. 1A to 1C illustrate a light-emitting module according to one embodiment.

Embodiments will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a structure of a light-emitting module according to one embodiment of the present invention is described. Specifically, a light-emitting module including a first substrate, a light-emitting element, formed on one surface side of the first substrate, a second substrate provided on the one surface side of the first substrate, a conductive spacer maintaining the gap between the first substrate and the second substrate, and a space in which the light-emitting element is sealed between the first substrate and the second substrate is described. Note that a first electrode and a partition having an opening over the first electrode are provided over the first substrate. The light-emitting element includes, in a position overlapping with the opening of the partition, the first electrode, a second electrode, and a layer containing a light-emitting organic compound between the first electrode and the second electrode. The second electrode is a metal thin film formed by an evaporation method with such a small thickness as to transmit light emitted from the layer containing a light-emitting organic compound. In a position overlapping with the light-emitting element, a region transmitting light emitted from the light-emitting element is provided over the second substrate. Further, the pressure in the space is lower than or equal to the atmospheric pressure. Furthermore, the conductive spacer is electrically connected to the second electrode in a position overlapping with the partition and is provided over a second substrate so as to reduce a voltage drop occurring in the second electrode.

In the above light-emitting module shown as an example in this embodiment, the conductive spacer provided over the second substrate is electrically connected, over the partition, to the second electrode of the light-emitting element which is provided over the first substrate, resulting in a reduction in voltage drop occurring in the second electrode. Accordingly, a light-emitting module from which light with uniform brightness is extracted can be provided. Further, a beautiful light-emitting module in which Newton's rings are not observed can be provided.

The light-emitting module shown as an example in this embodiment is described with reference to FIGS. 1A to 1C and FIGS. 2A to 2C.

Figure 1B:
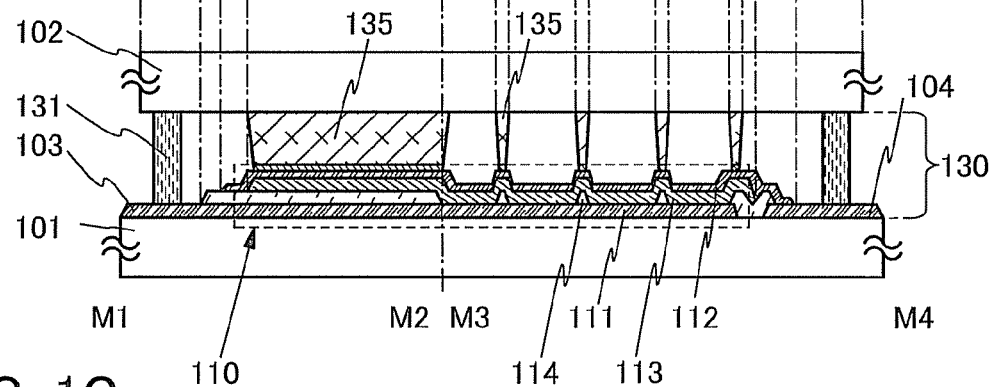
Figure 1C:
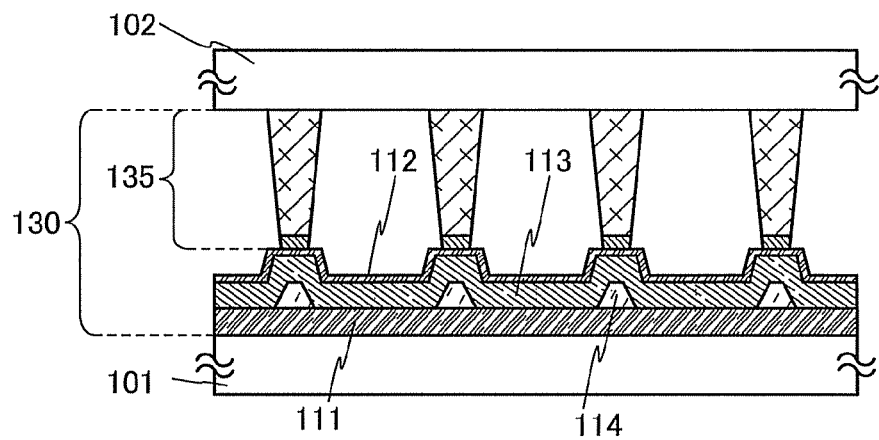

FIG. 1A is a top view of the light-emitting module according to one embodiment of the present invention, and FIG. 1B is a cross-sectional view along line M1-M2-M3-M4 in FIG. 1A. FIG. 1C illustrates part of FIG. 1B in detail.

A light-emitting module 100 illustrated in FIGS. 1A to 1C includes a first substrate 101, a light-emitting element 110 formed on one surface side of the first substrate 101, a second substrate 102 provided on the one surface side of the first substrate 101, a conductive spacer 135 maintaining the gap between the first substrate 101 and the second substrate 102, and a space 130 in which the light-emitting element 110 is sealed between the first substrate 101 and the second substrate 102. Note that a first electrode 111 and a partition 114 having an opening over the first electrode 111 are provided over the first substrate 101. The light-emitting element 110 includes, in a position overlapping with the opening of the partition 114, the first electrode 111, a second electrode 112, and a layer 113 containing a light-emitting organic compound between the first electrode 111 and the second electrode 112. The second electrode 112 is a metal thin film formed by an evaporation method with such a small thickness as to transmit light emitted from the layer 113 containing a light-emitting organic compound. In a position overlapping with the light-emitting element 110, a region transmitting light emitted from the light-emitting element 110 is provided over the second substrate 102. Further, the pressure in the space 130 is lower than or equal to the atmospheric pressure. Furthermore, the conductive spacer 135 is electrically connected to the second electrode 112 in a position overlapping with the partition 114 and is provided over a second substrate 102 so as to reduce a voltage drop occurring in the second electrode 112.

Note that a first terminal 103 is electrically connected to the first electrode 111, and a second terminal 104 is electrically connected to the second electrode 112. Both the first terminal 103 and the second terminal 104 extend to the outside of the sealed space 130 (see FIG. 1B).

(Structure of Sealed Space)

The space 130 is surrounded by the first substrate 101, the second substrate 102, and a sealant 131 that is provided so as to surround the light-emitting element 110. The first substrate 101 and the second substrate 102 are attached to each other with the sealant 131. Since the pressure in the space 130 is kept to be lower than or equal to the atmospheric pressure, the atmospheric pressure is applied to the first substrate 101 and the second substrate 102 and the substrates push each other.

(Structure of Light-Emitting Element)

Structures of the first electrode 111 and the second electrode 112 which are included in the light-emitting element no are described in detail in this embodiment. Other structures in the light-emitting element 110 (such as the layer 113 containing a light-emitting organic compound) are described in detail in Embodiment 5.

(First Electrode)

The first electrode 111 contains a conductive material, and may have a single-layer structure or a layered structure including two or more layers. There is no particular limitation on the thickness of the first electrode 111.

As the conductive material, any conductive material may be used as long as it has conductivity and can withstand the manufacturing process. For example, one metal selected from molybdenum, titanium, tantalum, tungsten, aluminum, silver, copper, chromium, neodymium, scandium, and the like, or an alloy containing the metal can be used.

Examples of an alloy containing aluminum include an aluminum-nickel-lanthanum alloy, an aluminum-titanium alloy, and an aluminum-neodymium alloy. Examples of an alloy containing silver include a silver-neodymium alloy and a magnesium-silver alloy. Further, an alloy containing gold and copper can be used.

A metal nitride can also be used as the conductive material. Specific examples of the metal nitride include titanium nitride, molybdenum nitride, and tungsten nitride.

A conductive metal oxide can also be used as the conductive material. Specifically, indium oxide, tin oxide, indium tin oxide (also referred to as ITO), indium zinc oxide, zinc oxide, zinc oxide to which gallium or aluminum is added, or the metal oxide material which contains silicon oxide can be used.

In this embodiment, a layered structure in which a layer containing titanium is stacked over a layer containing an aluminum-nickel-lanthanum alloy is used for the first electrode 111. The aluminum-nickel-lanthanum alloy has high reflectance and is preferably used for a reflective electrode. Further, the layer containing titanium can suppress a phenomenon in which an oxide film having high resistance is formed on the surface of the first electrode. As a result, loss of intensity of light emitted from the light-emitting element and loss of electric power due to electric resistance can be reduced.

(Second Electrode)

The second electrode 112 contains a conductive material and may have a single-layer structure or a layered structure including two or more layers.

The second electrode 112 is formed in contact with the layer 113 containing a light-emitting organic compound and has such a small thickness as to transmit light emitted from the layer 113 containing a light-emitting organic compound. The thickness is preferably greater than or equal to 5 nm and less than or equal to 30 nm. Since the thickness is thus small (i.e., a cross-sectional area is small), the electric resistance (possibly also referred to as sheet resistance) of the second electrode 112 tends to be increased.

As a metal that can be used for the second electrode 112, any metal may be used as long as it can be evaporated. For example, a precious metal, a rare earth metal, an alkali metal, or an alkaline earth metal can be used. Specifically, silver, gold, ytterbium, erbium, calcium, magnesium, or aluminum can be used. Alternatively, an alloy containing one of these metals, specifically, a silver-neodymium alloy, a magnesium-silver alloy, an aluminum-nickel-lanthanum alloy, an aluminum-titanium alloy, an aluminum-neodymium alloy, or the like can be used.

As a method for forming the second electrode 112, a vacuum evaporation method is preferable, and a heating evaporation method, an electron beam evaporation method, or the like is particularly preferable. When the second electrode 112 is formed by a sputtering method, the layer 113 containing a light-emitting organic compound serving as a base of the second electrode 112 might be damaged. Further, a large particle might be included in the second electrode 112 during its formation. Concentration of stress or electric field on such a particle causes generation of defects. Alternatively, a particle that is separated off with high kinetic energy from a target might collide with and damage the layer 113 containing a light-emitting organic compound. Further alternatively, an active energy ray, such as an ultraviolet ray, which is emitted from plasma formed in the vicinity of the target, might damage the layer 113 containing a light-emitting organic compound. Further alternatively, a sputtering gas might serve as an impurity of the light-emitting element to damage the reliability.

The light-emitting element 110 included in the light-emitting module 100 according to one embodiment of the present invention includes the second electrode 112 formed by a vacuum evaporation method. As a result, the layer 113 containing a light-emitting organic compound is unlikely to be damaged in the formation of the second electrode. Thus, the light-emitting module according to one embodiment of the present invention has high reliability.

Note that a microresonator (also referred to as a microcavity) may be formed by forming the first electrode 111 as a reflective electrode and the second electrode 112 as a semi-transmissive and semi-reflective electrode and adjusting the distance (optical distance) between the first electrode 111 and the second electrode 112, and light with a particular wavelength may be efficiently extracted through the semi-transmissive and semi-reflective second electrode 112.

(Structure of Partition)

The partition 114 contains an insulating material and may have a single-layer structure or a layered structure including two or more layers. There is no particular limitation on the thickness of the partition 114. In addition, the partition 114 preferably has a curved surface with curvature at an upper end portion or a lower end portion. For example, a portion of the partition 114, which is in contact with the first electrode 111, preferably has a gentle angle or curvature (e.g., greater than or equal to 0.2 µm and less than or equal to 3 µm). When an end portion of the partition 114 is formed such that a step is not generated between the partition 114 and the first electrode 111, a phenomenon in which the first electrode 111 and the second electrode 112 are short-circuited in the step portion can be prevented.

The partition 114 is formed using an insulating material which can resist the manufacturing process. For example, an insulating layer formed using one selected from photopolymer, a photosensitive acrylic resin, photosensitive polyimide, and the like, or an insulating layer containing one selected from these materials can be used.

The partition 114 has at least one opening over the first electrode 111 and is provided in a position overlapping with the conductive spacer 135 (see FIG. 1C). This embodiment shows a lattice-like partition 114 as an example.

A material applicable to the partition 114 has an insulating property; for example, a resin, an inorganic insulating material, or both in combination can be used. Specifically, a negative-type or positive-type photosensitive resin can be used. The photosensitive resin can be fainted so that an end portion has a gentle shape by adjusting exposure conditions.

Over the partition 114, the layer 113 containing a light-emitting organic compound and the second electrode 112 are stacked in this order.

(Structure of Conductive Spacer)

The conductive spacer 135 maintains the gap between the first substrate 101 and the second substrate 102, and reduces a voltage drop in the second electrode 112.

The conductive spacer 135 shown as an example in this embodiment is formed over the second substrate 102 in a position overlapping with the partition 114. The conductive spacer 135 supports the atmospheric pressure applied to the first substrate 101 and the second substrate 102 with the layer 113 containing a light-emitting organic compound and the second electrode 112 interposed between an edge of the conductive spacer 135 and the partition 114 (see FIG. 1C).

The height of the conductive spacer 135 can be, for example, 2 µm to 6 µm, typically 3 µm to 5 µm. When the conductive spacer is high, the directivity of light emitted from the light-emitting module increases; when the conductive spacer is short, the directivity of the light decreases. The high directivity is favorable for, for example, a lighting device that emits bright light in the front surface of the light-emitting module, and the low directivity is favorable for, for example, a light-emitting display device with a wide viewing angle.

The edge of the conductive spacer 135 is in contact with the second electrode 112 over the partition 114, so that the conductive spacer 135 is electrically connected to the second electrode 112 (see FIG. 1C). The conductive spacer 135 can have a variety of modes as long as a voltage drop is less likely to occur in the conductive spacer 135 and current can flow more easily in a wide range than in the second electrode 112.

Specifically, the conductive spacer 135 may have a stripe shape, a vein shape, a lattice shape, or a mesh shape.

In this embodiment, the lattice-like conductive spacer 135 is shown as an example (see FIG. 1A). In a portion where the conductive spacer 135 is continuous (e.g., a lattice portion from M1 to M2 in FIG. 1A), current easily flows. On the other hand, in a portion where the conductive spacer 135 is discontinuous (e.g., a portion from M3 to M4 in FIG. 1A), light emitted from the light-emitting element 110 is transmitted.

Note that this embodiment shows, as an example, a structure in which the conductive spacer 135 is provided for each portion where the partition 114 is formed; however, another structure is also possible in which the conductive spacer 135 is provided for every two portions where the partitions 114 are formed. The position of the conductive spacer 135 may be adjusted as appropriate so that uneven light emission (also referred to as uneven luminance) of the light-emitting element 110 due to a voltage drop in the second electrode 112 is not outstanding.

The effect of reducing a voltage drop becomes more distinguished as the electric resistance of the conductive spacer 135 decreases. As a method for decreasing the electric resistance of the conductive spacer 135, for example, a material with high conductivity may be used and/or a cross-sectional area may be increased.

Note that the proportion of the area occupied by the light-emitting element 110 in the area of the first substrate 101 is preferably large. This is because as the proportion of the area occupied by the light-emitting element 110 in the area of the first substrate 101 is larger, the light-emitting module can become brighter. Therefore, it is preferable that neither the conductive spacer 135 nor the partition 114 covers the first substrate 101 as much as possible.

The conductive spacer 135 particularly preferably has a small area covering the first substrate 101 and a large cross-sectional area. For example, as shown as an example in this embodiment, a mode in which the width is small and the height is large, in other words, the aspect ratio is high, is preferable.

The conductive spacer 135 can have a single-layer or layered structure formed using, for example, a metal, an alloy, a metal nitride, and/or a metal oxide. Specific examples of the metal and alloy include a material containing any element selected from aluminum, copper, chromium, tantalum, titanium, molybdenum, and tungsten.

An alloy containing aluminum has not only high conductivity but also high reflectance; accordingly, a phenomenon is suppressed in which light emitted from the light-emitting element 110 is absorbed to be quenched. As the alloy containing aluminum, aluminum containing nickel, aluminum containing lanthanum and nickel, or aluminum containing silicon can be used.

Specific examples of the metal nitride include titanium nitride, molybdenum nitride, and tungsten nitride.

The conductive spacer 135 can have a layered structure in which a refractory metal or the above-described metal nitride is provided on one or both of the lower side and the upper side of the layered structure. Note that specific examples of the refractory metal include chromium, tantalum, titanium, molybdenum, tungsten, neodymium, scandium, and yttrium. The structure in which such a material is stacked on one or both of the upper side and the lower side of an aluminum or copper film can avoid problems about heat resistance and corrosion of aluminum or copper.

The conductive spacer 135 shown as an example in this embodiment is formed by stacking an aluminum film and a titanium film in this order over the second substrate 102 and by processing the layered structure by a photolithography method. The structure in which the second electrode is in contact with the titanium layer can prevent an increase in electric resistance due to an oxide film formed over a surface of the conductive spacer 135.

(First Substrate and Second Substrate)

The first substrate 101 and the second substrate 102 each have heat resistance high enough to withstand the manufacturing process and are not particularly limited in thickness and size as long as they can be applied to a manufacturing apparatus. In addition, the first substrate 101 and the second substrate 102 may have a single-layer structure or a layered structure including two or more layers.

The first substrate 101 and the second substrate 102 preferably have gas barrier properties. A film having a gas barrier property may be formed between the first substrate 101 and the light-emitting element and between the second substrate 102 and the light-emitting element. Specifically, each of the first substrate 101 and the second substrate 102 preferably has such a gas barrier property that the vapor permeability is lower than or equal to $10^{-5}$ g/m$^2$·day, more preferably lower than or equal to $10^{-6}$ g/m$^2$·day, because in that case the reliability of the light-emitting module can be improved.

The first substrate 101 and the second substrate 102 may have flexibility. As a substrate having flexibility, other than a plastic substrate, thin glass having a thickness greater than or equal to 50 μm and less than or equal to 500 μm, or metal foil can be used.

In a position overlapping with the light-emitting element 110, at least a region that transmits light emitted from the light-emitting element 110 is provided over the second substrate 102.

Examples of a substrate that transmits visible light emitted from the light-emitting element 110 include a non-alkali glass substrate, a barium borosilicate glass substrate, an aluminoborosilicate glass substrate, a quartz substrate, a sapphire substrate, and a substrate including fiberglass-reinforced plastics (FRP), polyester, an acrylic resin, polyimide, or the like.

The first substrate 101 may have an insulating surface over which the light-emitting element is formed, and a plurality of light-emitting elements may be formed thereover. Further, a plurality of light-emitting elements may be formed over one substrate, and a plurality of light-emitting modules may be formed over the substrate. Note that an insulating property may be obtained by stacking an insulating film over the first substrate 101.

The surface of the first substrate 101 over which the light-emitting element is formed is preferably flat. Alternatively, a film for planarization may be formed by using a layered structure.

For the first substrate 101, a material which has difficulty in transmitting the light emitted from the light-emitting element 110 may be used. For example, any of ceramic substrates, metal substrates containing stainless steel, and the like may be used.

Further, a transistor may be provided over the first substrate 101 so that the transistor is connected to the first electrode included in the light-emitting element of the light-emitting module.

In the light-emitting module 100 described in this embodiment, a non-alkali glass substrate is used for each of the first substrate 101 and the second substrate 102.

Modification Example 1

Figure 2A:
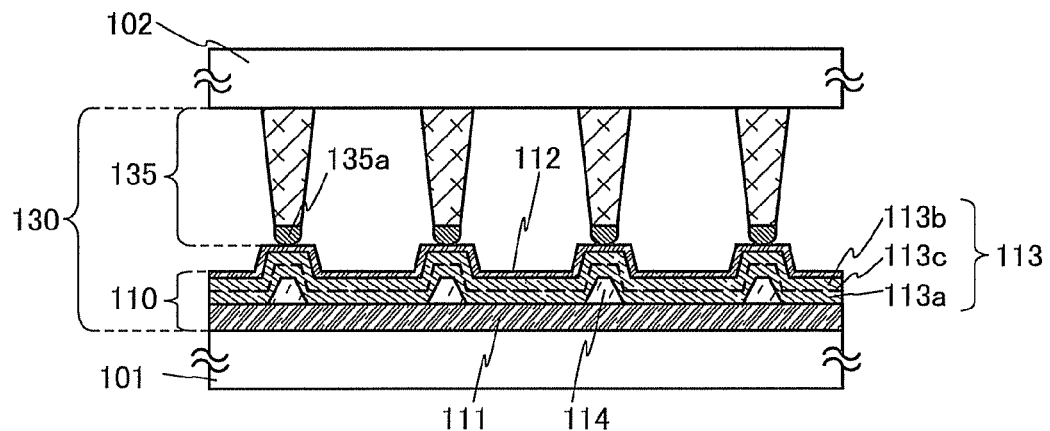
FIGS. 2A to 2C each illustrate a light-emitting module according to one embodiment.

A modification example 1 of the light-emitting module of this embodiment is described with reference to FIG. 2A. In a light-emitting module shown as an example in the modification example 1, the light-emitting element 110 includes a first layer 113a containing a light-emitting organic compound, a second layer 113b containing a light-emitting organic compound, and an intermediate layer 113c. Note that the intermediate layer 113c is provided between the first layer 113a containing a light-emitting organic compound and the second layer 113b containing a light-emitting organic compound.

Further, the conductive spacer 135 has an edge 135a in which a corner portion is chamfered to have a curved surface, and the edge 135a is in contact with the second electrode 112 of the light-emitting element 110 over the partition 114.

The conductive spacer 135 is provided such that the layers formed over the partition 114 are interposed between an edge of the conductive spacer 135 and the partition 114, and maintains the gap between the first substrate 101 and the second substrate 102. Therefore, the stress applied to the second substrate 102 is likely to concentrate on the edge of the conductive spacer 135.

However, the first layer 113a containing a light-emitting organic compound, the second layer 113b containing a light-emitting organic compound, and the second electrode 112, which are likely to be damaged, are formed over the partition 114.

In a case of the modification example 1 in this embodiment, the first layer 113a containing a light-emitting organic compound, the second layer 113b containing a light-emitting organic compound, the intermediate layer 113c, and the second electrode 112 are formed over the partition 114. The first and second layers, which have a thickness of about several tens to several hundreds of nanometers, and the second electrode 112, which is a metal layer with a thickness of about several nanometers, are likely to be damaged.

When the stress that concentrates on the edge of the conductive spacer 135 damages any of the layers formed over the partition 114, abnormal light emission of the light-emitting element 110 might be caused.

For example, when the second electrode 112 and the second layer 113b containing a light-emitting organic compound are damaged and the conductive spacer 135 and the intermediate layer 113c are short-circuited, in the periphery of the short-circuited portion, current flows between the first electrode 111 and the conductive spacer 135 without flowing in the second layer 113b containing a light-emitting organic compound. As a result, light emission from the second layer 113b containing a light-emitting organic compound might be quenched or the intensity or color thereof might be changed.

However, according to one embodiment of the present invention, the edge 135a of the conductive spacer 135 has a corner portion that is chamfered to have a curved surface, whereby a phenomenon can be prevented in which such a high stress as to damage the layers formed over the partition 114 concentrates on the edge 135a of the conductive spacer 135. As a result, a light-emitting module in which abnormal light emission is prevented and from which light with uniform brightness is extracted can be provided. Further, a beautiful light-emitting module in which abnormal light emission is prevented and Newton's rings are not observed can be provided.

Modification Example 2

A modification example 2 of the light-emitting module of this embodiment is described with reference to FIG. 2B. In a light-emitting module shown as an example in the modification example 2, the conductive spacer 135 includes a layer 135b with a low reflectance on the second substrate 102 side.

The layer 135b with a low reflectance is formed using a material that is unlikely to reflect outside light; for example, a colored conductive layer or a colored insulating layer can be used.

Examples of the colored conductive layer include a metal layer, a metal nitride layer, and a resin layer in which a filler is dispersed; specifically, it is possible to use gold, copper, titanium nitride, a resin in which carbon black is dispersed, or the like. Further, examples of the colored insulating layer include an insulating inorganic material layer and a resin layer in which a pigment is dispersed.

Figure 2B:
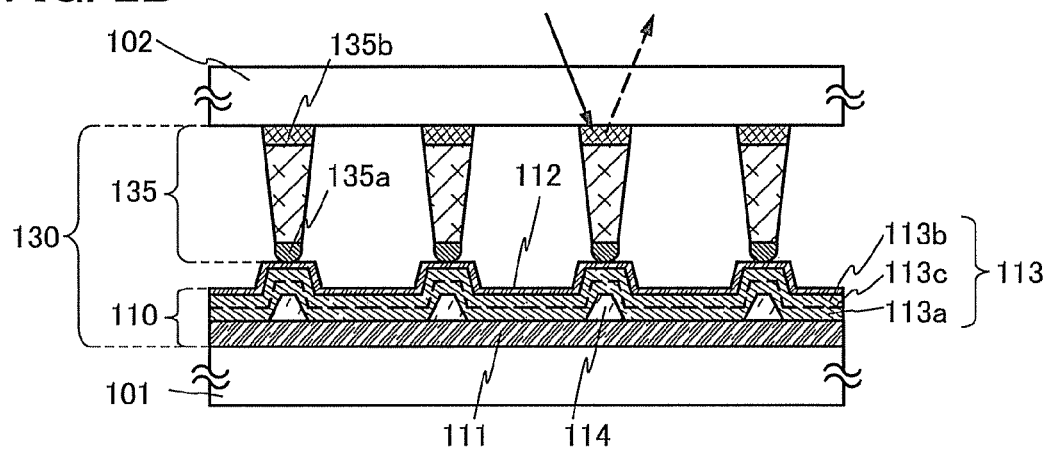

The layer 135b with a low reflectance absorbs part of outside light that enters the conductive spacer from the second substrate 102 side (indicated by an arrow shown by a solid line in FIG. 2B) and part of outside light that is reflected by the other layer(s) included in the conductive spacer (indicated by an arrow shown by a dashed line in FIG. 2B). As a result, a light-emitting module in which the reflection of the outside light is suppressed and from which light with uniform brightness is extracted can be provided. Further, a beautiful light-emitting module in which the reflection of the outside light is suppressed and Newton's rings are not observed can be provided.

Modification Example 3

Figure 2C:
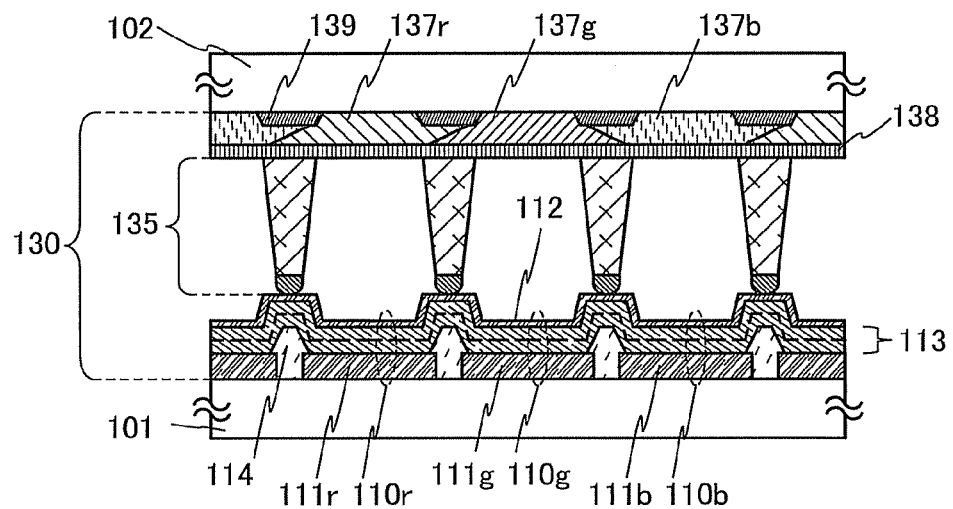

A modification example 3 of the light-emitting module of this embodiment is described with reference to FIG. 2C. In FIG. 2C, as one embodiment of the light-emitting module, an example of a structure including a plurality of light-emitting modules is shown. Note that such a structure can also be referred to as a light-emitting panel. The light-emitting panel shown as an example in FIG. 2C includes the first substrate 101, a plurality of light-emitting elements formed on one surface side of the first substrate 101 (e.g., a light-emitting element 110r, a light-emitting element 110g, and a light-emitting element 110b), the second substrate 102 provided on the one surface side of the first substrate 101, the conductive spacer 135 maintaining the gap between the first substrate 101 and the second substrate 102, and the space 130 in which the light-emitting elements are sealed between the first substrate 101 and the second substrate 102.

Note that a plurality of first electrodes (e.g., a first electrode 111r, a first electrode 111g, and a first electrode 111b) and the partitions 114 having openings over the respective plurality of first electrodes are provided over the first substrate 101. Each of the plurality of first electrodes serves as the first electrode of the independent light-emitting element, and each light-emitting element includes, in a position overlapping with the opening of the partition 114, the first electrode, the second electrode 112, and the layer 113 containing a light-emitting organic compound between the first electrode and the second electrode 112. The second electrode 112 is a metal thin film that has such a small thickness as to transmit light emitted from the layer 113 containing a light-emitting organic compound, and is formed by an evaporation method.

A region provided with a color filter (e.g., a color filter 137r) that transmits part of light emitted from the light-emitting element 110r, is provided in a position overlapping with the light-emitting element 110r over the second substrate 102, a region provided with a color filter (e.g., a color filter 137g) that transmits part of light emitted from the light-emitting element 110g is provided in a position overlapping with the light-emitting element 110g over the second substrate 102, and a region provided with a color filter (e.g., a color filter 137b) that transmits part of light emitted from the light-emitting element 110b is provided in a position overlapping with the light-emitting element 110b over the second substrate 102. Note that a protective layer 138 covering the color filters may be provided.

Further, the pressure in the space 130 is lower than or equal to the atmospheric pressure. Furthermore, the conductive spacer 135 is electrically connected to the second electrode 112 in a position overlapping with the partition 114 and is provided over the second substrate 102 so as to reduce a voltage drop occurring in the second electrode 112.

Further, when the conductive spacer 135 is formed using a light-blocking material, occurrence of a phenomenon in which light emitted from a light-emitting element provided in one light-emitting module enters a color filter provided in another adjacent light-emitting module (i.e., a crosstalk phenomenon) can be prevented.

Note that the color filters extend between the second substrate 102 and the conductive spacer 135. Further, a light-blocking layer 139 may be provided between the second substrate 102 and the conductive spacer 135.

The above light-emitting panel according to one embodiment of the present invention includes a plurality of light-emitting modules that can be independently driven, and in each of the light-emitting modules, the color filters each overlap with the light-emitting element. Further, the color filters extend between the second substrate and the conductive spacer. Each of the color filters not only selectively extracts light of one color, which is emitted from the light-emitting element, but also absorbs part of outside light that enters the conductive spacer from the second substrate side and part of outside light that is reflected by the conductive spacer. As a result, a light-emitting panel in which the reflection of the outside light is suppressed and from which light with uniform brightness is extracted can be provided. Further, a beautiful light-emitting panel in which the reflection of the outside light is suppressed and Newton's rings are not observed can be provided.

Modification Example of Light-Emitting Element

The light-emitting panel shown as an example in the modification example 3 includes the plurality of light-emitting modules, and the plurality of light-emitting modules is electrically independent from one another. Each of the plurality of light-emitting elements includes one layer 113 containing a light-emitting organic compound, one second electrode 112, and the electrically independent first electrode. For example, the light-emitting element 110r, the light-emitting element 110g, and the light-emitting element 110b include the first electrode 111r, the first electrode 111g, and the first electrode 111b, respectively.

Since the first electrodes can be formed by a photolithography method, easier separation and higher resolution can be achieved than in a structure in which another layer (specifically, the layer containing a light-emitting organic compound or the second electrode) is separately formed for each light-emitting module.

Note that the light-emitting modules included in the light-emitting panel shown as an example in the modification example 3 are provided with a plurality of light-emitting elements each of which emits white light (specifically, light including red light, green light, and blue light).

Modification Example of Second Substrate

In each of the light-emitting modules included in the light-emitting panel shown as an example in the modification example 3, the color filter that transmits part of light emitted from the light-emitting element is provided over the second substrate.

Red light is emitted from a light-emitting module in which the color filter 137*r* that transmits red light overlaps with the light-emitting element that emits white light, green light is emitted from a light-emitting module in which the color filter 137*g* that transmits green light overlaps with the light-emitting element that emits white light, and blue light is emitted from a light-emitting module in which the color filter 137*b* that transmits blue light overlaps with the light-emitting element that emits white light. Note that in addition to these light-emitting modules, a light-emitting module that emits white light (e.g., a light-emitting module having a structure in which a color filter is not provided over the second substrate) may be provided.

The color filter overlapping with one light-emitting element extends in the direction overlapping with an adjacent light-emitting element(s). For example, the color filter 137*g* overlapping with the light-emitting element 110*g* extends in the direction overlapping with the adjacent light-emitting element 110*r* and in the direction overlapping with the adjacent light-emitting element 110*b*. On the other hand, the color filter 137*r* overlapping with the light-emitting element 110*r* extends in the color filter 137*g* side, and the color filter 137*b* overlapping with the light-emitting element 110*b* extends in the color filter 137*g* side.

Note that it is preferable that adjacent two color filters do not overlap with one light-emitting element. This is because when a plurality of color filters overlaps with one light-emitting element, light of bright color can not be obtained.

Note that the protective layer 138 may be provided so as to cover the color filters. The protective layer 138 may have a single-layer structure or a layered structure including two or more layers. There is no particular limitation on the thickness of the protective layer 138.

The protective layer 138 flattens unevenness formed on surfaces of the color filters. Alternatively, the protective layer 138 suppresses a phenomenon in which an impurity contained in the color filter and/or the light-blocking layer 139 diffuses into the space 130 in which the light-emitting element is formed. The protective layer 138 is formed using a material that can withstand the manufacturing process; for example, a layer including one selected from a polyimide layer, an epoxy resin layer, and an acrylic resin layer can be used. Note that the protective layer 138 may be either of a thermosetting type or an ultraviolet curing type.

In this embodiment, a case of using polyimide for the protective layer 138 is described.

The color filters 137*r*, 137*g*, and 137*b* transmit at least part of light emitted from the layer 113 containing a light-emitting organic compound. The color filters may each have a single-layer structure or a layered structure including two or more layers. There is no particular limitation on the thickness of each of the color filters.

Each of the color filters is formed using a material that can withstand the manufacturing process; for example, an organic material layer containing a coloring material or a multilayer filter can be used.

Examples of the organic material layer containing a coloring material include a layer that transmits red light, a layer that transmits green light, and a layer that transmits blue light.

In each of the light-emitting modules included in the light-emitting panel shown as an example in the modification example 3, the conductive spacer 135 is provided to overlap with the color filter. The color filter absorbs part of the outside light that enters the conductive spacer 135 from the second substrate 102 side and part of the outside light that is reflected by the conductive spacer 135. As a result, a light-emitting panel in which the reflection of the outside light is suppressed and from which light with uniform brightness is extracted can be provided. Further, a beautiful light-emitting panel in which the reflection of the outside light is suppressed and Newton's rings are not observed can be provided.

It is particularly preferable that adjacent two color filters partly overlap with each other over the partition 114, and that the conductive spacer 135 overlap with the partition and the part where the two color filters overlap with each other. This is because when the two color filters overlap with each other, part of the outside light that enters the conductive spacer 135 from the second substrate 102 side and part of the outside light that is reflected by the conductive spacer 135 are efficiently absorbed.

Further, the light-blocking layer 139 may be formed between the second substrate 102 and the conductive spacer 135.

The light-blocking layer 139 includes a layer that blocks light transmitted through the second substrate 102. The light-blocking layer 139 may have a single-layer structure or a layered structure including two or more layers.

The layer that blocks light transmitted through the second substrate 102 is formed using a material which prevents light transmitted through the second substrate 102 from entering the light-emitting module and can withstand the manufacturing process. For example, one light-blocking layer selected from a chromium layer, a titanium layer, a nickel layer, a high molecular layer in which carbon black is dispersed, or the like can be used.

In this embodiment, a resin layer in which carbon is dispersed is used for the light-blocking layer 139.

The light-blocking layer 139 absorbs part of the outside light that enters the conductive spacer 135 from the second substrate 102 side and part of the outside light that is reflected by the conductive spacer 135, thereby suppressing the reflection of the outside light.

This embodiment can be combined with any of the other embodiments in this specification as appropriate.

Embodiment 2

In this embodiment, a structure of a light-emitting module according to another embodiment of the present invention is described. Specifically, a light-emitting module including a first substrate, a light-emitting element formed on one surface side of the first substrate, a second substrate provided on the one surface side of the first substrate, a conductive spacer maintaining the gap between the first substrate and the second substrate, and a space in which the light-emitting element is sealed between the first substrate and the second substrate is described. Note that a first electrode and a partition having an opening over the first electrode are provided over the first substrate. The light-emitting element includes, in a position overlapping with the opening of the partition, the first electrode, a second electrode, and a layer containing a light-emitting organic compound between the first electrode and the second electrode. The second electrode is a metal thin film formed by an evaporation method with such a small thickness as to transmit light emitted from the layer containing a light-emitting organic compound. In a position overlapping with the light-emitting element, a region transmitting light emitted from the light-emitting element is provided over the second substrate. Further, the pressure in the space is lower than or equal to the atmospheric pressure. Furthermore, the conductive spacer is electrically connected to the second electrode in a position overlapping with the partition and is provided over a first substrate so as to reduce a voltage drop occurring in the second electrode.

In the above light-emitting module shown as an example in this embodiment, the conductive spacer provided over the first substrate is electrically connected, over the partition, to the second electrode of the light-emitting element which is provided over the first substrate, resulting in a reduction in voltage drop occurring in the second electrode. Accordingly, a light-emitting module from which light with uniform brightness is extracted can be provided. Further, a beautiful light-emitting module in which Newton's rings are not observed can be provided.

The light-emitting module shown as an example in this embodiment is described with reference to FIGS. 3A to 3C and FIG. 4.

Figure 3A:
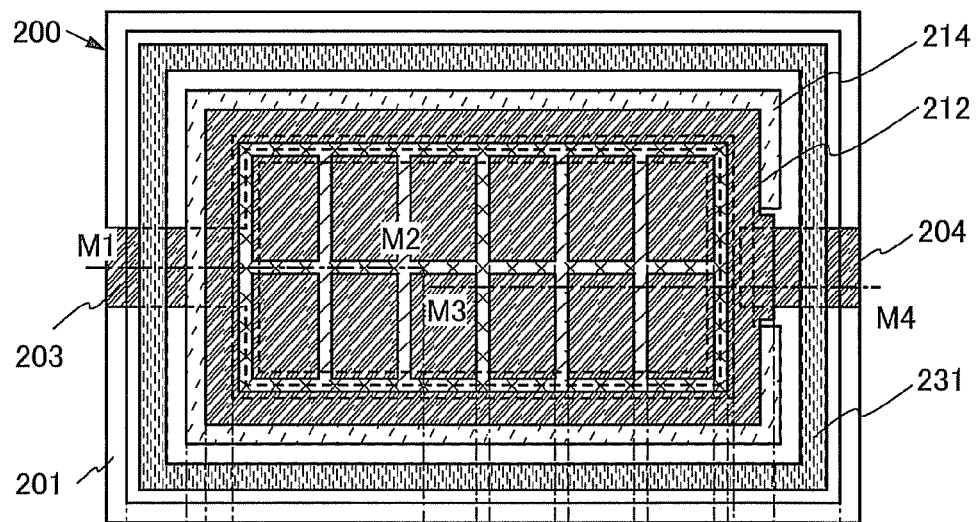
FIGS. 3A to 3C illustrate a light-emitting module according to one embodiment.
Figure 3B:
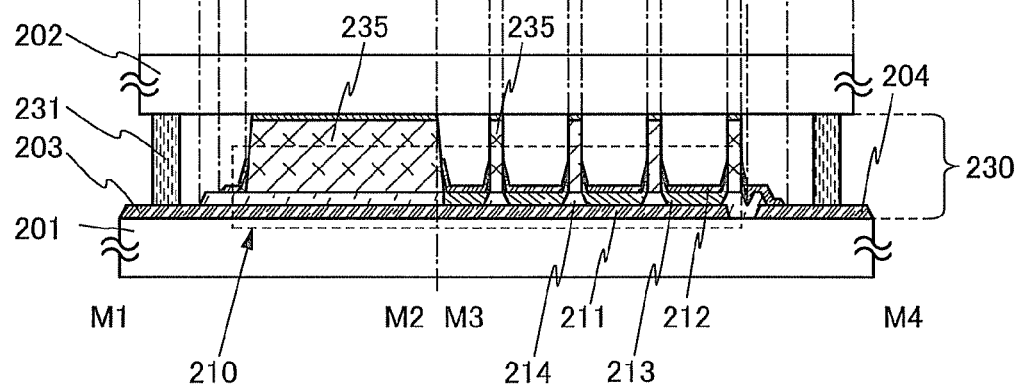
Figure 3C:
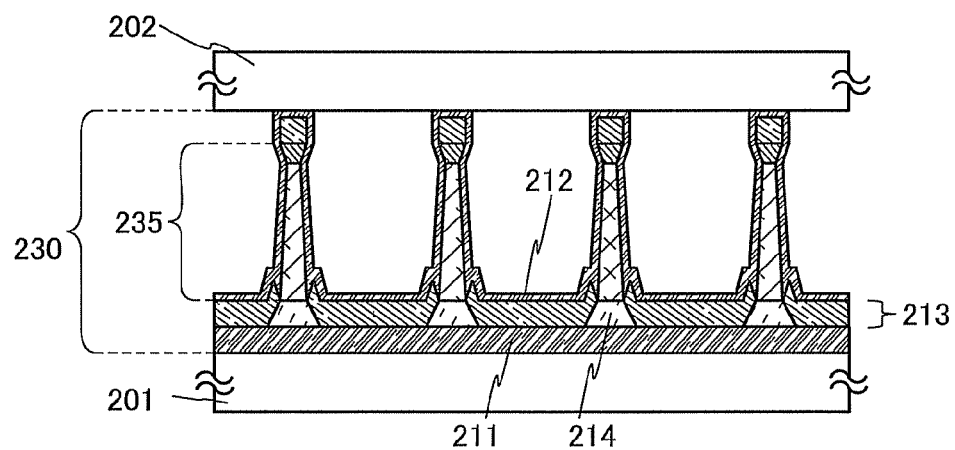

FIG. 3A is a top view of the light-emitting module according to one embodiment of the present invention, and FIG. 3B is a cross-sectional view along line M1-M2-M3-M4 in FIG. 3A. FIG. 3C illustrates part of FIG. 3B in detail.

A light-emitting module 200 illustrated in FIGS. 3A to 3C includes a first substrate 201, a light-emitting element 210 formed on one surface side of the first substrate 201, a second substrate 202 provided on the one surface side of the first substrate 201, a conductive spacer 235 maintaining the gap between the first substrate 201 and the second substrate 202, and a space 230 in which the light-emitting element 210 is sealed between the first substrate 201 and the second substrate 202. Note that a first electrode 211 and a partition 214 having an opening over the first electrode 211 are provided over the first substrate 201. The light-emitting element 210 includes, in a position overlapping with the opening of the partition 214, the first electrode 211, a second electrode 212, and a layer 213 containing a light-emitting organic compound between the first electrode 211 and the second electrode 212. The second electrode 212 is a metal thin film formed by an evaporation method with such a small thickness as to transmit light emitted from the layer 213 containing a light-emitting organic compound. In a position overlapping with the light-emitting element 210, a region transmitting light emitted from the light-emitting element 210 is provided over the second substrate 202. Further, the pressure in the space 230 is lower than or equal to the atmospheric pressure. Furthermore, the conductive spacer 235 is electrically connected to the second electrode 212 in a position overlapping with the partition 214 and is provided over a first substrate 201 so as to reduce a voltage drop occurring in the second electrode 212.

Note that a first terminal 203 is electrically connected to the first electrode 211, and a second terminal 204 is electrically connected to the second electrode 212. Both the first terminal 203 and the second terminal 204 extend to the outside of the sealed space 230 (see FIG. 3B).

(Structure of Sealed Space)

The space 230 is surrounded by the first substrate 201, the second substrate 202, and a sealant 231 that is provided so as to surround the light-emitting element 210. The first substrate 201 and the second substrate 202 are attached to each other with the sealant 231. Since the pressure in the space 230 is kept to be lower than or equal to the atmospheric pressure, the atmospheric pressure is applied to the first substrate 201 and the second substrate 202 and the substrates push each other.

(Structure of Light-Emitting Element)

The first electrode 211 included in the light-emitting element 210 shown as an example in this embodiment can have a structure similar to the structure of the first electrode 111 described in detail in Embodiment 1. Further, the layer 213 containing a light-emitting organic compound can have a structure similar to a structure of a layer containing a light-emitting organic compound, which is described in detail in Embodiment 5.

Thus, the light-emitting element 210 included in the light-emitting module 200 according to one embodiment of the present invention includes the second electrode 212 formed by a vacuum evaporation method. As a result, the layer 213 containing a light-emitting organic compound is unlikely to be damaged. Thus, the light-emitting module according to one embodiment of the present invention has high reliability.

(Structure of Partition)

The partition 214 has at least one opening over the first electrode 211, and the conductive spacer 235 is provided so as to overlap with the partition 214 (see FIG. 3C). This embodiment shows a lattice-like partition 214 as an example.

A portion of the partition 214, which is in contact with the first electrode 211, preferably has a gentle angle or curvature (e.g., greater than or equal to 0.2 μm and less than or equal to 3 μm). When an end portion of the partition 214 is formed such that a step is not generated between the partition 214 and the first electrode 211, a phenomenon in which the first electrode 211 and the second electrode 212 are short-circuited in the step portion can be prevented.

A material applicable to the partition 214 has an insulating property; for example, a resin, an inorganic insulating material, or both in combination can be used. Specifically, a negative-type or positive-type photosensitive resin can be used. The photosensitive resin can be formed so that an end portion has a gentle shape by adjusting exposure conditions.

Over the partition 214, the layer 213 containing a light-emitting organic compound and the second electrode 212 are stacked in this order.

(Structure of Conductive Spacer)

The conductive spacer 235 maintains the gap between the first substrate 201 and the second substrate 202, and reduces a voltage drop in the second electrode 212.

The conductive spacer 235 shown as an example in this embodiment is formed over the partition 214 formed over the first substrate 201. The conductive spacer 235 supports the atmospheric pressure applied to the first substrate 201 and the second substrate 202 with the layer 213 containing a light-emitting organic compound and the second electrode 212 interposed between an edge of the conductive spacer 235 and the second substrate 202 (see FIG. 3C).

The height of the conductive spacer 235 can be, for example, 2 μm to 6 μm, typically 3 μm to 5 μm. When the conductive spacer is high, the directivity of light emitted from the light-emitting module increases; when the conductive spacer is short, the directivity of the light decreases. The high directivity is favorable for, for example, a lighting device that emits bright light in the front surface of the light-emitting module, and the low directivity is favorable for, for example, a light-emitting display device with a wide viewing angle.

Further, the conductive spacer 235 is electrically connected to the second electrode 212. The conductive spacer 235 can have a variety of modes as long as a voltage drop is less likely to occur in the conductive spacer 235 and current can flow more easily in a wide range than in the second electrode 212.

For example, the conductive spacer 235 may have a stripe shape, a vein shape, a lattice shape, or a mesh shape.

In this embodiment, the lattice-like conductive spacer 235 is shown as an example (see FIG. 3A). In a portion where the conductive spacer 235 is continuous (e.g., a lattice portion from M1 to M2 in FIG. 3A), current easily flows. On the other hand, in a portion where the conductive spacer 235 is discontinuous (e.g., a portion from M3 to M4 in FIG. 3A), light emitted from the light-emitting element 210 is transmitted.

Note that the conductive spacer 235 is preferably formed so as to have a T-shaped or reversely tapered cross section. When the layer 213 containing a light-emitting organic compound is formed over such a conductive spacer 235 by a highly anisotropic deposition method and a conductive film that is to serve as the second electrode 212 is formed by an anisotropic evaporation method in oblique directions toward side surfaces of the conductive spacer 235, the second electrode 212 can be electrically connected to the side surfaces of the conductive spacer 235.

Even when the second electrode 212 is formed by a deposition method that is more highly anisotropic than the deposition method for forming the layer 213 containing a light-emitting organic compound, a similar electrical connection can be obtained. Note that having a T-shaped or reversely tapered cross section means that the area of a shape of an upper portion of the conductive spacer 235 projected on the first substrate 201 overlaps with and is larger than the area of a shape of a lower portion of the conductive spacer 235 projected on the first substrate 201.

Note that this embodiment shows, as an example, a structure in which the conductive spacer 235 is provided for each portion where the partition 214 is formed; however, another structure is also possible in which the conductive spacer 235 is provided for every two portions where the partitions 214 are formed. The position of the conductive spacer 235 may be adjusted as appropriate so that a voltage drop in the second electrode 212 is not outstanding.

The effect of reducing a voltage drop becomes more distinguished as the electric resistance of the conductive spacer 235 decreases. As a method for decreasing the electric resistance of the conductive spacer 235, for example, a material with high conductivity may be used and/or a cross-sectional area may be increased.

Note that the proportion of the area occupied by the light-emitting element 210 in the area of the first substrate 201 is preferably large. This is because as the proportion of the area occupied by the light-emitting element 210 in the area of the first substrate 201 is larger, the light-emitting module can become brighter. Therefore, it is preferable that neither the conductive spacer 235 nor the partition 214 covers the first substrate 201 as much as possible. For example, as shown as an example in this embodiment, a mode in which the width is small and the height is large, in other words, the aspect ratio is high, is preferable.

The conductive spacer 235 can have a single-layer or layered structure formed using, for example, a metal, an alloy, a metal nitride, and/or a medal oxide. Specific examples of the metal and alloy include a material containing any element selected from aluminum, copper, chromium, tantalum, titanium, molybdenum, and tungsten.

An alloy containing aluminum has not only high conductivity but also high reflectance; accordingly, a phenomenon is suppressed in which light emitted from the light-emitting element 210 is absorbed to be quenched. As the alloy containing aluminum, aluminum containing nickel, aluminum containing lanthanum and nickel, or aluminum containing silicon can be used.

Specific examples of the metal nitride include titanium nitride, molybdenum nitride, and tungsten nitride.

The conductive spacer 235 can have a layered structure in which a refractory metal or the above-described metal nitride is provided on one or both of the lower side and the upper side of the layered structure. Note that specific examples of the refractory metal include chromium, tantalum, titanium, molybdenum, tungsten, neodymium, scandium, and yttrium. The structure in which such a material is stacked on one or both of the upper side and the lower side of an aluminum or copper film can avoid problems about heat resistance and corrosion of aluminum or copper. Further, in the case where the conductive spacer 235 has a layered structure, a layer with a low reflectance may be used for the uppermost layer of the conductive spacer 235. As a material of the layer with a low reflectance, a material which is the same or substantially the same as that described in the modification example 2 can be used.

The conductive spacer 235 shown as an example in this embodiment is formed by stacking an aluminum film and a titanium film in this order over the first substrate 201 and by processing the layered structure by a photolithography method.

(First Substrate and Second Substrate)

The first substrate 201 and the second substrate 202 each have heat resistance high enough to withstand the manufacturing process and are not particularly limited in thickness and size as long as they can be applied to a manufacturing apparatus. In addition, the first substrate 201 and the second substrate 202 may have a single-layer structure or a layered structure including two or more layers.

The first substrate 201 and the second substrate 202 preferably have gas barrier properties. A film having a gas barrier property may be formed between either substrate and the light-emitting element. Specifically, each of the first substrate 101 and the second substrate 102 preferably has such a gas barrier property that the vapor permeability is lower than or equal to $10^{-5}$ g/m$^2$·day, more preferably lower than or equal to $10^{-6}$ g/m$^2$·day, because in that case the reliability of the light-emitting module can be improved.

The first substrate 201 and the second substrate 202 may have flexibility. As a substrate having flexibility, other than a plastic substrate, thin glass having a thickness greater than or equal to 50 μm and less than or equal to 500 μm, or metal foil can be used.

In a position overlapping with the light-emitting element 210, at least a region that transmits light emitted from the light-emitting element 210 is provided over the second substrate 202.

Examples of a substrate that transmits visible light emitted from the light-emitting element 210 include a non-alkali glass substrate, a barium borosilicate glass substrate, an aluminoborosilicate glass substrate, a quartz substrate, a sapphire substrate, and a substrate including fiberglass-reinforced plastics (FRP), polyester, an acrylic resin, polyimide, or the like.

The first substrate 201 may have an insulating surface over which the light-emitting element is formed, and a plurality of light-emitting elements may be formed thereover. Further, a plurality of light-emitting elements may be formed over one substrate, and a plurality of light-emitting modules may be formed over the substrate. Note that an insulating property may be obtained by stacking an insulating film over the first substrate 201.

The surface of the first substrate 201 over which the light-emitting element is formed is preferably flat. Alternatively, a film for planarization may be formed by using a layered structure.

For the first substrate 201, a material which has difficulty in transmitting the light emitted from the light-emitting element 210 may be used. For example, any of ceramic substrates, metal substrates containing stainless steel, and the like may be used.

Further, a transistor may be provided over the first substrate 201 so that the transistor is connected to the first electrode included in the light-emitting element of the light-emitting module.

In the light-emitting module 200 described in this embodiment, a non-alkali glass substrate is used for each of the first substrate 201 and the second substrate 202.

Modification Example

Figure 4:
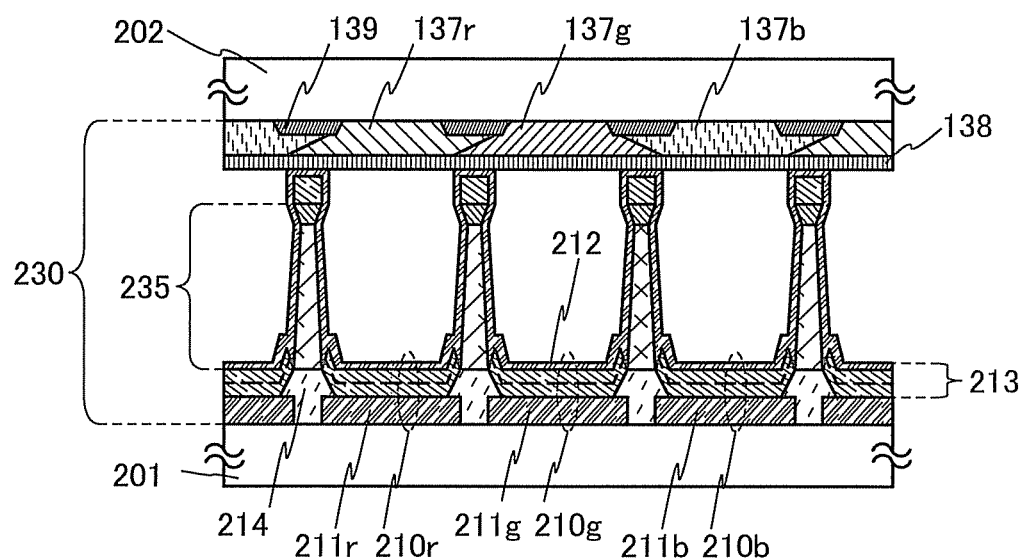
FIG. 4 illustrates a light-emitting module according to one embodiment.

A modification example of the light-emitting module of this embodiment is described with reference to FIG. 4. In FIG. 4, as one embodiment of the light-emitting module, an example of a structure including a plurality of light-emitting modules is shown. Note that such a structure can also be referred to as a light-emitting panel. The light-emitting panel shown as an example in FIG. 4 includes the first substrate 201, a plurality of light-emitting elements formed on one surface side of the first substrate 201 (e.g., a light-emitting element 210r, a light-emitting element 210g, and a light-emitting element 210b), the second substrate 202 provided on the one surface side of the first substrate 201, the conductive spacer 235 maintaining the gap between the first substrate 201 and the second substrate 202, and the space 230 in which the light-emitting elements are sealed between the first substrate 201 and the second substrate 202.

Note that a plurality of first electrodes and the partition 214 having openings over the respective plurality of first electrodes are provided over the first substrate 201. Each light-emitting element includes, in a position overlapping with the opening of the partition 214, the first electrode, the second electrode 212, and the layer 213 containing a light-emitting organic compound between the first electrode and the second electrode 212. The light-emitting modules shown as examples in the modification example include a plurality of first electrodes (e.g., a first electrode 211r, a first electrode 211g, and a first electrode 211b) each serving as the first electrode of the independent light-emitting element. The second electrode 212 is a metal thin film that has such a small thickness as to transmit light emitted from the layer 213 containing a light-emitting organic compound, and is formed by an evaporation method.

A region provided with a color filter (e.g., a color filter 137r, a color filter 137g, a color filter 137b) that transmits part of light emitted from the light-emitting element 210 is provided in a position overlapping with the light-emitting element 210 over the second substrate 202. Note that a protective layer 138 covering the color filters may be provided.

Further, the pressure in the space 230 is lower than or equal to the atmospheric pressure. Furthermore, the conductive spacer 235 is electrically connected to the second electrode 212 in a position overlapping with the partition 214 and is provided over the first substrate 201 so as to reduce a voltage drop occurring in the second electrode 212.

Note that the color filters extend between the second substrate 202 and the conductive spacer 235. Further, a light-blocking layer 139 may be provided between the second substrate 202 and the conductive spacer 235.

The above light-emitting panel according to one embodiment of the present invention includes a plurality of light-emitting modules that can be independently driven, and in each of the light-emitting modules, the color filters each overlap with the light-emitting element. Further, the color filters extend between the second substrate and the conductive spacer. Each of the color filters not only selectively extracts light of one color, which is emitted from the light-emitting element, but also absorbs part of outside light that enters the conductive spacer from the second substrate side and part of outside light that is reflected by the conductive spacer. As a result, a light-emitting panel in which the reflection of the outside light is suppressed and from which light with uniform brightness is extracted can be provided. Further, a beautiful light-emitting panel in which the reflection of the outside light is suppressed and Newton's rings are not observed can be provided.

Modification Example of Light-Emitting Element

The light-emitting panel shown as an example in the modification example in this embodiment includes the plurality of light-emitting modules, and the plurality of light-emitting modules is electrically independent from one another. Each of the plurality of light-emitting elements includes one layer 213 containing a light-emitting organic compound, one second electrode 212, and the electrically independent first electrode. For example, the light-emitting element 210r, the light-emitting element 210g, and the light-emitting element 210b include the first electrode 211r, the first electrode 211g, and the first electrode 211b, respectively.

Since the first electrodes can be formed by a photolithography method, easier separation and higher resolution can be achieved than in a structure in which another layer (specifically, the layer containing a light-emitting organic compound or the second electrode) is separately formed for each light-emitting module.

Note that the light-emitting modules included in the light-emitting panel shown as an example in the modification example are provided with a plurality of light-emitting elements each of which emits white light (specifically, light including red light, green light, and blue light).

Modification Example of Second Substrate

In each of the light-emitting modules included in the light-emitting panel shown as an example in the modification example in this embodiment, a color filter that transmits part of light emitted from the light-emitting element is provided over the second substrate.

Red light is emitted from a light-emitting module in which the color filter 137r that transmits red light overlaps with the light-emitting element that emits white light, green light is emitted from a light-emitting module in which the color filter 137g that transmits green light overlaps with the light-emitting element that emits white light, and blue light is emitted from a light-emitting module in which the color filter 137b that transmits blue light overlaps with the light-emitting element that emits white light. Note that in addition to these light-emitting modules, a light-emitting module that emits white light (e.g., a light-emitting module having a structure in which a color filter is not provided over the second substrate) may be provided.

The color filter overlapping with one light-emitting element extends in the direction overlapping with an adjacent light-emitting element(s). For example, the color filter 137g overlapping with the light-emitting element 210g extends in the direction overlapping with the adjacent light-emitting element 210r and in the direction overlapping with the adjacent light-emitting element 210b. On the other hand, the color filter 137r overlapping with the light-emitting element 210r extends in the color filter 137g side, and the color filter 137b overlapping with the light-emitting element 210b extends in the color filter 137g side.

Note that it is preferable that adjacent two color filters do not overlap with one light-emitting element. This is because when a plurality of color filters overlaps with one light-emitting element, light of bright color can not be obtained.

Note that the protective layer 138 may be provided so as to cover the color filters.

In each of the light-emitting modules included in the light-emitting panel shown as an example in the modification example, the conductive spacer 235 is provided to overlap with the color filter. The color filter absorbs part of the outside light that enters the conductive spacer 235 from the second substrate 202 side and part of the outside light that is reflected by the conductive spacer 235. As a result, a light-emitting panel in which the reflection of the outside light is suppressed and from which light with uniform brightness is extracted can be provided. Further, a beautiful light-emitting panel in which the reflection of the outside light is suppressed and Newton's rings are not observed can be provided.

It is particularly preferable that adjacent two color filters partly overlap with each other over the partition 214, and that the conductive spacer 235 overlap with the partition and the part where the two color filters overlap with each other. This is because when the two color filters overlap with each other, part of the outside light that enters the conductive spacer 235 from the second substrate 202 side and part of the outside light that is reflected by the conductive spacer 235 are efficiently absorbed.

Further, the light-blocking layer 139 may be formed between the second substrate 202 and the conductive spacer 235. This is because the light-blocking layer 139 absorbs part of the outside light that enters the conductive spacer 235 from the second substrate 202 side and part of the outside light that is reflected by the conductive spacer 235.

This embodiment can be combined with any of the other embodiments in this specification as appropriate.

Embodiment 3

Figure 5A:
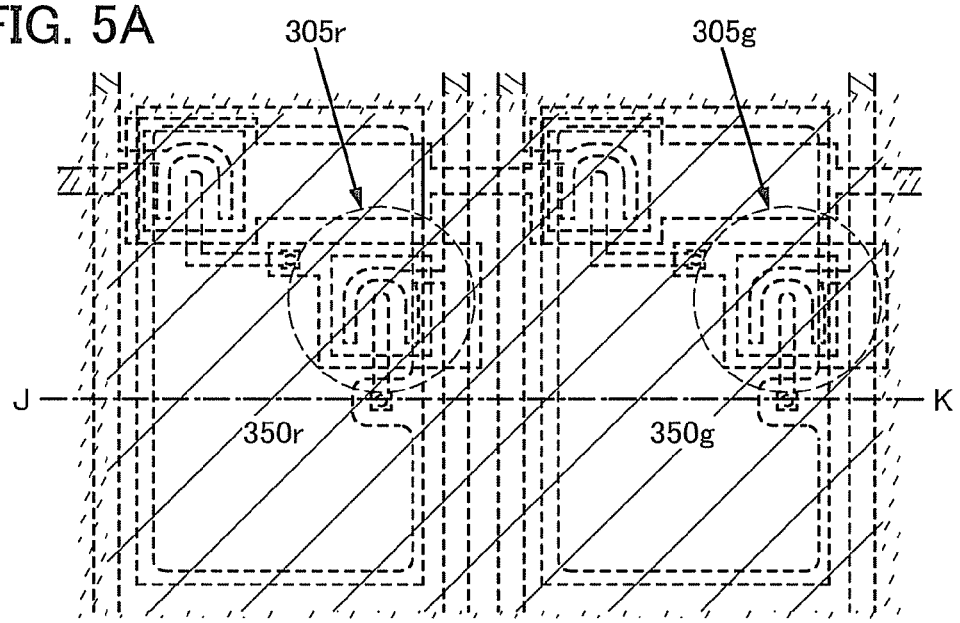
FIGS. 5A and 5B illustrate a light-emitting, panel including light-emitting modules according to one embodiment.
Figure 5B:
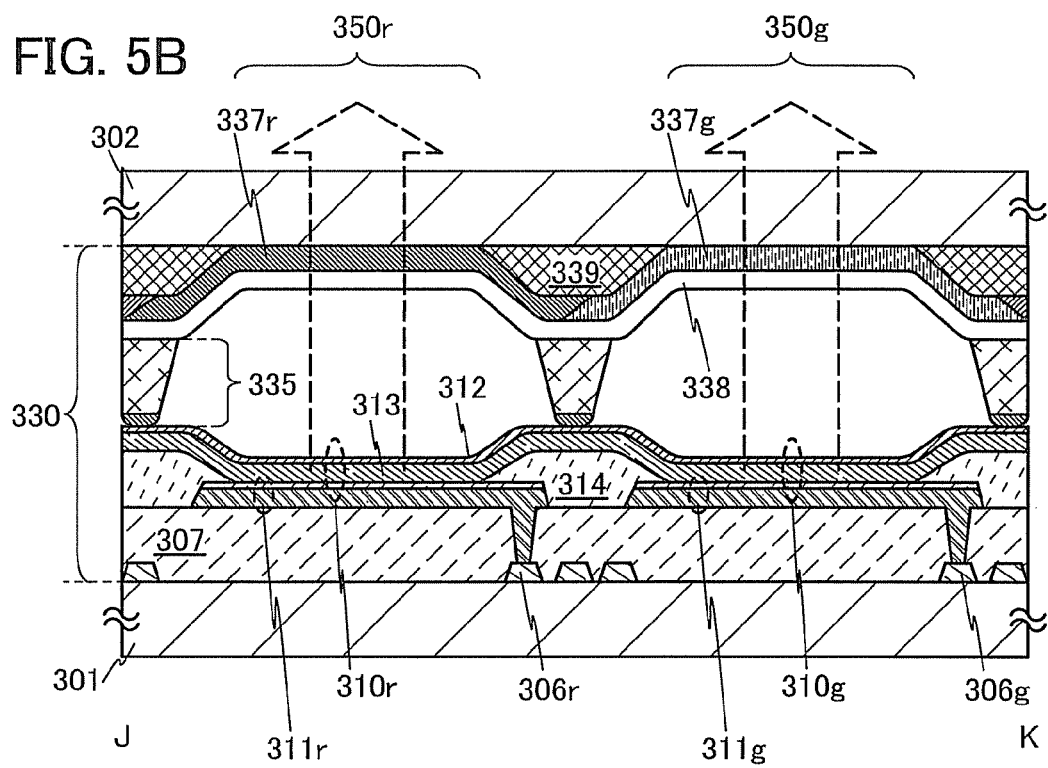

In this embodiment, a structure of a light-emitting panel including light-emitting modules according to one embodiment of the present invention is described with reference to FIGS. 5A and 5B. FIG. 5A is a top view of the light-emitting panel including light-emitting modules according to one embodiment of the present invention, and FIG. 5B is a cross-sectional view along line J-K in FIG. 5A. The light-emitting panel shown as an example in FIG. 5B emits light in the direction indicated by arrows in FIG. 5B. Note that the light-emitting panel shown as an example in this embodiment can be used for a display device.

The light-emitting panel shown in this embodiment includes transistors (e.g., a transistor 305r and a transistor 305g) and light-emitting modules (e.g., a light-emitting module 350r and a light-emitting module 350g) each of which is connected to a source electrode or a drain electrode of the corresponding transistor. Each light-emitting module can be independently driven. The light-emitting panel further includes a first substrate 301, light-emitting elements (e.g., a light-emitting element 310r and a light-emitting element 310g) formed on one surface side of the first substrate 301, a second substrate 302 provided on the one surface side of the first substrate 301, a conductive spacer 335 maintaining the gap between the first substrate 301 and the second substrate 302, and a space 330 in which the light-emitting elements are sealed between the first substrate 301 and the second substrate 302.

Note that a plurality of first electrodes (e.g., a first electrode 311r and a first electrode 311g) and partitions 314 having openings over the respective plurality of first electrodes are provided over the first substrate 301. Each of the plurality of first electrodes serves as a first electrode of an independent light-emitting element, and each light-emitting element includes, in a position overlapping with the opening of the partition 314, the first electrode, a second electrode 312, and a layer 313 containing a light-emitting organic compound between the first electrode and the second electrode 312. The second electrode 312 is a metal thin film that has such a small thickness as to transmit light emitted from the layer 313 containing a light-emitting organic compound, and is formed by an evaporation method.

Further, an insulating layer 307, conductive layers (e.g., a conductive layer 306r and a conductive layer 306g each of which is connected to a source electrode or a drain electrode of a transistor), and transistors (e.g., a transistor 305r and a transistor 305g) are provided between one surface of the first substrate 301 and the light-emitting element formed over the one surface.

Note that in a position overlapping with the light-emitting element, a region provided with color filters (e.g., a color filter 337r and a color filter 337g) that transmit part of light emitted from the light-emitting elements is provided over the second substrate 302. A protective layer 338 covering the color filters may be provided.

The pressure in the space 330 is lower than or equal to the atmospheric pressure. Further, the conductive spacer 335 provided over the first substrate 301 is electrically connected to the second electrode 312 in a position overlapping with the partition 314 so as to reduce a voltage drop occurring in the second electrode 312.

Note that the color filters extend between the second substrate 302 and the conductive spacer 335. A light-blocking layer 339 may be provided between the second substrate 302 and the conductive spacer 335.

The above light-emitting panel according to one embodiment of the present invention includes the plurality of light-emitting modules that can be independently driven, and in each of the light-emitting modules, the color filters each overlap with the light-emitting element. Further, the color filters extend between the second substrate and the conductive spacer. Each of the color filters not only selectively extracts light of one color, which is emitted from the light-emitting element, but also absorbs part of outside light that enters the conductive spacer from the second substrate side and part of outside light that is reflected by the conductive spacer. As a result, a light-emitting panel in which the reflection of the outside light is suppressed and from which light with uniform brightness is extracted can be provided. Further, a beautiful light-emitting panel in which the reflection of the outside light is suppressed and Newton's rings are not observed can be provided.

For the light-emitting panel shown in this embodiment, the structure described in the modification example 3 in Embodiment 1 can be used. Specifically, for the first substrate 301, the light-emitting elements (e.g., the light-emitting element 310r and the light-emitting element 310g), the second substrate 302, the conductive spacer 335, the space 330, the first electrodes (e.g., the first electrode 311r and the first electrode 311g), the partition 314, the layer 313 containing a light-emitting organic compound, the second electrode 312, the color filters (e.g., the color filter 337r and the color filter 337g), and the protective layer 338, structures similar to the respective structures described in the modification example 3 in Embodiment 1 can be used. Therefore, the description of the modification example 3 in Embodiment 1 is referred to, and a detailed description is omitted in this embodiment.

(Conductive Layer)

The conductive layers 306r and 306g have conductivity. The conductive layers 306r and 306g may each have a single-layer structure of a layer containing a conductive material or a layered structure including two or more layers each containing a conductive material. There is no particular limitation on the thicknesses of the conductive layers 306r and 306g.

As the conductive material, any conductive material may be used as long as it has conductivity and can withstand the manufacturing process. For example, a metal selected from molybdenum, titanium, tantalum, tungsten, aluminum, copper, chromium, neodymium, scandium, and the like, or an alloy containing one of these metals can be used.

Alternatively, a metal nitride can be used as the conductive material. Specific examples of the metal nitride include titanium nitride, molybdenum nitride, and tungsten nitride.

Further alternatively, a conductive metal oxide can be used as the conductive material. Specifically, indium oxide, tin oxide, indium tin oxide (also referred to as ITO), indium zinc oxide, zinc oxide, zinc oxide to which gallium or aluminum is added, or the metal oxide material which contains silicon oxide can be used.

Further alternatively, graphene or the like can be used as the conductive material.

In this embodiment, a structure in which a stack obtained by stacking titanium over an aluminum alloy is used as each of the conductive layers 306r and 306g is described.

(Insulating Layer)

The insulating layer 307 has an insulating property. The insulating layer 307 may have a single-layer structure or a layered structure including two or more layers. There is no particular limitation on the thickness of the insulating layer 307.

Note that a surface of the insulating layer 307 is preferably flat. This is because if unevenness of the surface of the insulating layer 307 is reflected on the surface of the first electrode of the light-emitting module that overlaps with the surface of the insulating layer 307, the first electrode and the second electrode may be short-circuited.

Any insulating material may be used as long as it has an insulating property and can withstand the manufacturing process; for example, one insulating layer selected from a silicon oxide layer, a silicon oxynitride layer, an aluminum oxide layer, an acrylic resin layer, a polyimide resin layer, a benzocyclobutene resin layer, a polyamide resin layer, an epoxy resin layer, a siloxane-based resin layer, an SOG layer, a polysilazane-based SOG layer, and the like, or a layer including any of the insulating layers can be used.

In this embodiment, a structure in which a polyimide layer is used as the insulating layer 307 is described.

A transistor may be formed over the first substrate 310, and a source electrode or a drain electrode of the transistor may be electrically connected to the first electrode 311r via the conductive layer 306r or to the first electrode 311g via the conductive layer 306g. With such a structure, a light-emitting panel in which each light-emitting module independently emits light can be provided, and the light-emitting device can be applied to a display device, for example.

(Structure of Layer Containing Light-Emitting Organic Compound)

The layer 313 containing a light-emitting organic compound contains at least a light-emitting organic compound. The layer 313 containing a light-emitting organic compound may have a single-layer structure or a layered structure including two or more layers. Note that a structure of the layer containing a light-emitting organic compound is described in detail in Embodiment 5.

This embodiment shows a structure in which the layer 313 containing a light-emitting organic compound is formed using a layer emitting white light.

In each of the light-emitting modules included in the light-emitting panel shown as an example in this embodiment, the conductive spacer 335 is provided to overlap with the color filter. The color filter absorbs part of outside light that enters the conductive spacer 335 from the second substrate 302 side and part of outside light that is reflected by the conductive spacer 335. As a result, a light-emitting panel in which the reflection of the outside light is suppressed and from which light with uniform brightness is extracted can be provided. Further, a beautiful light-emitting panel in which the reflection of the outside light is suppressed and Newton's rings are not observed can be provided.

It is particularly preferable that adjacent two color filters partly overlap with each other over the partition 314, and that the conductive spacer 335 overlap with the partition 314 and the part where the two color filters overlap with each other. This is because when the two color filters overlap with each other, part of the outside light that enters the conductive spacer 335 from the second substrate 302 side and part of the outside light that is reflected by the conductive spacer 335 are efficiently absorbed.

Further, the light-blocking layer 339 may be formed between the second substrate 302 and the conductive spacer 335. This is because the light-blocking layer 339 absorbs part of the outside light that enters the conductive spacer 335 from the second substrate 302 side and part of the outside light that is reflected by the conductive spacer 335.

Further, when the conductive spacer 335, which is provided between the second substrate 302 and the partition 314, has a light-blocking property, occurrence of a phenomenon in which light emitted from a light-emitting element provided in one light-emitting module enters a color filter provided in another adjacent light-emitting module (i.e., a crosstalk phenomenon) can be prevented.

Specifically, occurrence of a phenomenon in which light emitted from the light-emitting element 310r provided in the light-emitting module 350r enters the color filter 337g provided in the light-emitting module 350g can be prevented by the conductive spacer 335. With use of the light-blocking conductive spacer 335, a light-emitting panel with less crosstalk and with excellent color reproducibility can be provided.

This embodiment can be combined with any of the other embodiments in this specification as appropriate.

Embodiment 4

In this embodiment, a structure of a light-emitting device including a light-emitting module according to one embodiment of the present invention is described with reference to FIGS. 6A and 6B.

Specifically, the light-emitting module shown as an example in this embodiment includes a first substrate, a light-emitting element formed on one surface side of the first substrate, a second substrate, a conductive spacer maintaining the gap between the first substrate and the second substrate, and a space in which the light-emitting element is sealed between the first substrate and the second substrate. Note that a first electrode and a partition having an opening over the first electrode are provided over the first substrate. The light-emitting element includes, in a position overlapping with the opening of the partition, the first electrode, a second electrode, and a layer containing a light-emitting organic compound between the first electrode and the second electrode. The second electrode is a metal thin film formed by an evaporation method with such a small thickness as to transmit light emitted from the layer containing a light-emitting organic compound. In a position overlapping with the light-emitting element, a region transmitting light emitted from the light-emitting element is provided over the second substrate. Further, the pressure in the space is lower than or equal to the atmospheric pressure. Furthermore, the conductive spacer is electrically connected to the second electrode in a position overlapping with the partition and is provided over a second substrate so as to reduce a voltage drop occurring in the second electrode. Note that the light emitted from the layer containing a light-emitting organic compound is extracted from the second substrate side through the second electrode formed using the metal thin film.

In the above light-emitting device according to one embodiment of the present invention, the conductive spacer provided over the second substrate is electrically connected to the second electrode of the light-emitting element which is provided over the first substrate, resulting in a reduction in voltage drop occurring in the second electrode. Accordingly, a light-emitting device from which light with uniform brightness is extracted can be provided. Further, a beautiful light-emitting device in which Newton's rings are not observed can be provided.

In this embodiment, an active matrix light-emitting device in which the light-emitting module according to one embodiment of the present invention is connected to a transistor is described; however, one embodiment of the present invention is not limited to the active matrix light-emitting device and can also be applied to a passive matrix light-emitting device, a display device, or a lighting device.

(Active Matrix Light-Emitting Device)

Figure 6A:
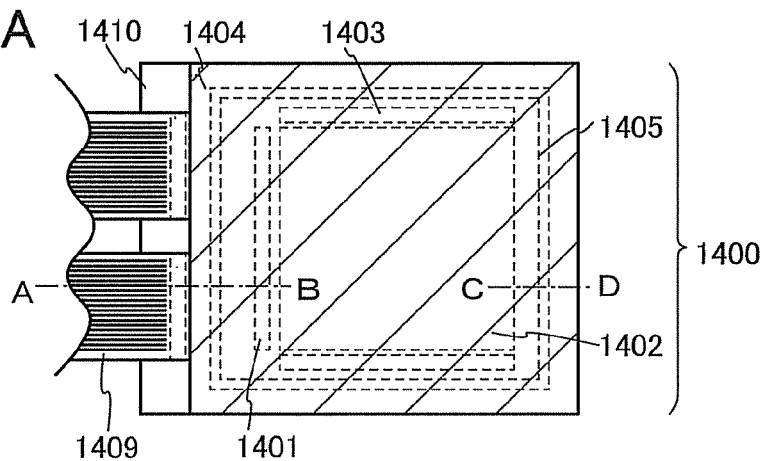
FIGS. 6A and 6B illustrate a light-emitting device including a light-emitting module according to one embodiment.
Figure 6B:
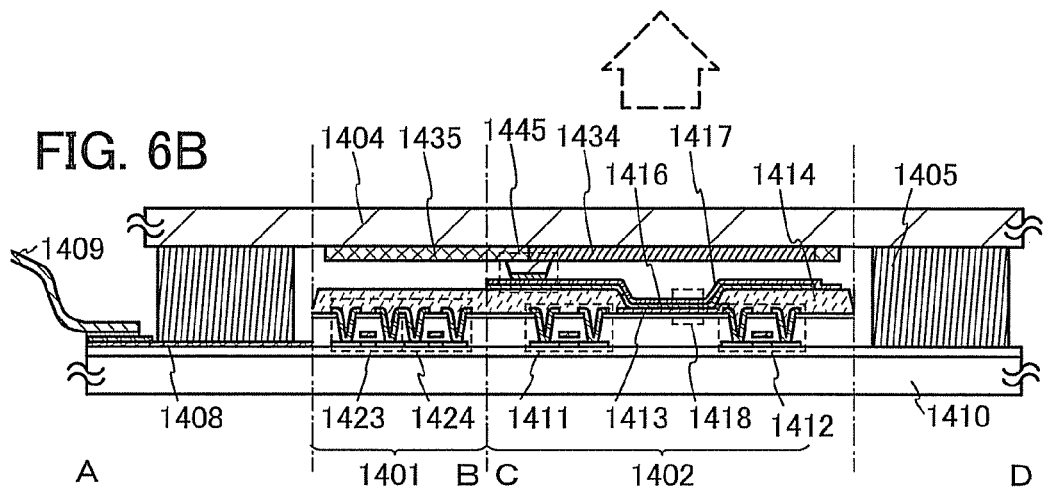

FIGS. 6A and 6B illustrate a structure in which the light-emitting module according to one embodiment of the present invention is applied to an active matrix light-emitting device. Note that FIG. 6A is a top view of the light-emitting device, and FIG. 6B is a cross-sectional view taken along lines A-B and C-D in FIG. 6A.

An active matrix light-emitting device 1400 includes a driver circuit portion (source driver circuit) 1401, a pixel portion 1402, a driver circuit portion (gate driver circuit) 1403, a second substrate 1404, and a sealant 1405 (see FIG. 6A). Note that a portion enclosed by the sealant 1405 is a space.

The light-emitting device 1400 receives a video signal, a clock signal, a start signal, a reset signal, and the like from an FPC (flexible printed circuit) 1409 that is an external input terminal. Note that only the FPC is illustrated here; however, the FPC may be provided with a printed wiring board (PWB). The light-emitting device in this specification includes, in its category, not only the light-emitting device itself but also the light-emitting device provided with the FPC or the PWB.

Next, a structure of the light-emitting device 1400 is described with reference to the cross-sectional view of FIG. 6B. The light-emitting device 1400 includes, over a first substrate 1410, a driver circuit portion including the source driver circuit 1401 illustrated and the pixel portion 1402 including a pixel illustrated. Further, the light-emitting device 1400 includes a lead wiring 1408 for transmitting signals that are to be input to the source driver circuit 1401 and the gate driver circuit 1403.

Note that although this embodiment shows, as an example, a structure in which the source driver circuit 1401 includes a CMOS circuit in which an n-channel transistor 1423 and a p-channel transistor 1424 are combined, the driver circuit is not limited to this structure and may be any of a variety of circuits, such as a CMOS circuit, a PMOS circuit, or an NMOS circuit. Further, although this embodiment shows a driver-integrated type where the driver circuit is formed over the substrate, the present invention is not limited to this, and the driver circuit may be formed outside the substrate, not over the substrate.

(Structure of Transistor)

Note that any of a variety of semiconductors can be used for a region where a channel of a transistor is formed. Specifically, as well as amorphous silicon, polysilicon, or single crystal silicon, an oxide semiconductor or the like can be used.

Use of a single crystal semiconductor for the region where the channel of a transistor is formed can reduce the size of the transistor, which results in higher resolution pixels in a display portion.

As a single crystal semiconductor used for forming a semiconductor layer, a semiconductor substrate, typical examples of which include a single crystal semiconductor substrate formed using elements belonging to Group 14, such as a single crystal silicon substrate, a single crystal germanium substrate, or a single crystal silicon germanium substrate, and a compound semiconductor substrate (e.g., a SiC substrate, a sapphire substrate, and a GaN substrate), can be used. Preferred one is a silicon on insulator (SOI) substrate in which a single crystal semiconductor layer is provided on an insulating surface.

An SOI substrate can be fabricated by the following method: after oxygen ions are implanted in a mirror-polished wafer, the wafer is heated at high temperatures to form an oxidized layer at a certain depth from a surface of the wafer and eliminate defects generated in a surface layer. Alternatively, an SOI substrate can be fabricated by the method in which the semiconductor substrate is separated by utilizing the growth of microvoids formed by hydrogen ion irradiation (this growth is caused by heat treatment). Further alternatively, an SOI substrate can be fabricated by the method in which a single crystal semiconductor layer is formed on an insulating surface by crystal growth.

In this embodiment, ions are added through one surface of a single crystal semiconductor substrate, an embrittlement layer is formed at a certain depth from the one surface of the single crystal semiconductor substrate, and an insulating layer is formed over the one surface of the single crystal semiconductor substrate or over the first substrate 1410. Heat treatment is performed in a state where the single crystal semiconductor substrate and the first substrate 1410 are bonded to each other with the insulating layer interposed therebetween, so that a crack is generated in the embrittlement layer and the single crystal semiconductor substrate is separated along the embrittlement layer. Thus, a single crystal semiconductor layer, which is separated from the single crystal semiconductor substrate, is formed as a semiconductor layer over the first substrate 1410. Note that a glass substrate can be used as the first substrate 1410.

Further, regions electrically insulated from each other may be formed in the semiconductor substrate so that transistors 1411 and 1412 may be formed using the regions electrically insulated from each other.

The use of the single crystal semiconductor as a channel formation region can reduce variation in electric characteristics of a transistor, such as threshold voltage, due to a bonding defect at a crystal grain boundary. Hence, in the light-emitting device according to one embodiment of the present invention, the light-emitting element can operate normally without providing a circuit for compensating the threshold voltage in each pixel. The number of circuit elements per pixel can therefore be reduced, increasing the flexibility in layout. Thus, a high-resolution light-emitting device can be achieved. For example, a display device having a matrix of a plurality of pixels, specifically 350 pixels or more per one inch (i.e., the horizontal resolution is 350 pixels per inch (ppi) or more), more preferably 400 or more pixels per one inch (i.e., the horizontal resolution is 400 ppi or more) can be achieved.

Moreover, a transistor in which a single crystal semiconductor is used as the channel formation region can be downsized while keeping high current drive capability. The use of the downsized transistor leads to a reduction in the area of the circuit portion that does not contribute to display operation, resulting in an increase in the area of a region of the display portion where an image is displayed and a reduction in the frame size of the light-emitting device.

(Structure of Pixel)

The pixel portion 1402 is provided with a plurality of pixels. The pixel includes a light-emitting element 1418, a current controlling transistor 1412 whose drain electrode is connected to a first electrode 1413 of the light-emitting element 1418, and a switching transistor 1411.

The light-emitting element 1418 included in the light-emitting panel includes the first electrode 1413, a second electrode 1417, and a layer 1416 containing a light-emitting organic compound. Note that a partition wall 1414 is formed so as to cover an end portion of the first electrode 1413.

As a structure of the light-emitting element 1418, a structure of a light-emitting element shown as an example in Embodiment 5 can be employed, for example.

Specifically, a structure in which white light is emitted can be employed for the layer 1416 containing a light-emitting organic compound.

With the first electrode 1413 and the second electrode 1417 of the light-emitting element 1418, a micro resonator (also referred to as microcavity) can be formed. For example, the first electrode 1413 is formed using a conductive film which reflects light emitted from the layer 1416 containing a light-emitting organic compound, and the second electrode 1417 is formed using a semi-transmissive and semi-reflective conductive film which reflects part of the light and transmits part of the light.

An optical adjustment layer can be provided between the first electrode and the second electrode. The optical adjustment layer is a layer which adjusts the optical path length between the reflective first electrode 1413 and the semi-transmissive and semi-reflective second electrode 1417. By adjustment of the thickness of the optical adjustment layer, the wavelength of light preferentially extracted from the second electrode 1417 can be adjusted.

For a material which can be used for the optical adjustment layer, a layer containing a light-emitting organic compound can be used. For example, the thickness of the optical adjustment layer may be adjusted using a charge generation region. Specifically, a region containing a substance having a high hole-transport property and an acceptor substance is preferably used for the optical adjustment layer because an increase in drive voltage can be suppressed even when the optical adjustment layer is thick.

A light-transmitting conductive film which transmits light emitted from the layer 1416 containing a light-emitting organic compound can also be employed for a material that can be used for the optical adjustment layer. For example, the light-transmitting conductive film is stacked on a surface of a reflective conductive film; thus, the first electrode 1413 can be formed. Such a structure is preferable because the thickness of an optical adjustment layer of an adjacent first electrode is easily changed.

The partition 1414 is formed to have a curved surface with curvature at an upper end portion or a lower end portion thereof. Either a negative photosensitive resin or a positive photosensitive resin can be used for the partition 1414. For example, in a case of using a positive photosensitive acrylic resin as a material for the partition 1414, it is preferable that the partition 1414 be formed so as to have a curved surface with radius of curvature (0.2 μm to 3 μm) only at the upper end portion thereof. Here, the partition 1414 is formed using a positive photosensitive polyimide film.

Note that when the partition has a light-blocking property, reflection of outside light on a reflective film included in the light-emitting panel can be suppressed. When a reflective film which extends outside the light-emitting element 1418 reflects outside light, the contrast of the light-emitting device is lowered; for that reason, bright light emission cannot be obtained. In the case where the partition has a light-blocking property, the partition can be formed using a resin layer colored with black.

A color filter 1434 can be provided so as to overlap with the light-emitting element 1418. In addition, a light-blocking film 1435 (also referred to as a black matrix) can be provided so as to overlap with a partition between adjacent light-emitting elements. Note that the color filter 1434 and the light-blocking film 1435 can be provided over the second substrate 1404.

(Sealing Structure)

The light-emitting device 1400 shown as an example in this embodiment has a structure in which the light-emitting element 1418 is sealed in a space surrounded by the first substrate 1410, the second substrate 1404, and the sealant 1405.

The sealant 1405 and the second substrate 1404 are desirably formed using a material which does not transmit impurities in the air (such as water and/or oxygen) as much as possible. An epoxy-based resin, glass frit, or the like can be used for the sealant 1405.

Examples of the second substrate 1404 include a glass substrate; a quartz substrate; a plastic substrate faulted of polyvinyl fluoride (PVF), polyester, an acrylic resin, or the like; a substrate of fiberglass-reinforced plastics (FRP); and the like.

In the light-emitting device illustrated in FIG. 6B, the first substrate and the second substrate are attached to each other with the sealant 1405 which surrounds the light-emitting element 1418. The sealant 1405 prevents impurities which reduce the reliability of the light-emitting element 1418 from entering the light-emitting module. As a result, a light-emitting module with high reliability can be provided.

Note that the sealant 1405 does not include a spacer maintaining the gap between the first substrate 1410 and the second substrate 1404. The conductive spacer 1445 maintains the gap between the first substrate 1410 and the second substrate 1404 constant. In a case where a filler or a spherical spacer is dispersed in the sealant 1405, when the first substrate 1410 and the second substrate 1404 are attached to each other, stress might concentrate on the filler or the spherical spacer so as to damage a transistor or wiring that is formed over the first substrate below the sealant 1405. In the light-emitting device shown as an example in this embodiment, since the conductive spacer 1445 maintains the gap between the first substrate 1410 and the second substrate 1404 constant over the partition, the transistor and the wiring are unlikely to be damaged. In particular, the partition serves as a buffer and has an effect of dispersing the stress.

With use of the light-emitting module according to one embodiment of the present invention, a light-emitting panel from which light with uniform brightness is extracted can be provided. Alternatively, a beautiful light-emitting panel in which Newton's rings are not observed can be provided.

This embodiment can be combined with any of the other embodiments in this specification as appropriate.

Embodiment 5

This embodiment shows a structure of a light-emitting element which can be used for a light-emitting module according to one embodiment of the present invention. Specifically, an example of a light-emitting element in which a layer containing a light-emitting organic compound is interposed between a pair of electrodes is described with reference to FIGS. 7A to 7E.

The light-emitting element shown as an example in this embodiment includes a first electrode, a second electrode, and a layer containing a light-emitting organic compound (hereinafter referred to as an EL layer) provided between the first electrode and the second electrode. Note that one of the first electrode and the second electrode functions as an anode, and the other functions as a cathode. The EL layer is provided between the first electrode and the second electrode, and a structure of the EL layer may be appropriately selected in accordance with materials of the first electrode and second electrode. An example of the structure of the light-emitting element is described below; it is needless to say that the structure of the light-emitting element is not limited to this example.

Structure Example 1 of Light-Emitting Element

Figure 7A:
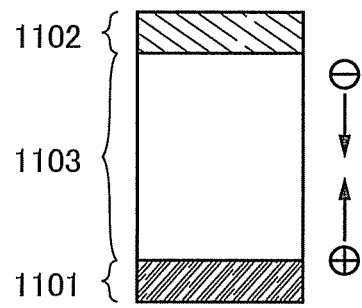
FIGS. 7A to 7E each illustrate a light-emitting element that can be applied to a light-emitting module according to one embodiment.

An example of the structure of the light-emitting element is illustrated in FIG. 7A. In the light-emitting element illustrated in FIG. 7A, an EL layer is provided between an anode 1101 and a cathode 1102.

When a voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stack which includes one region where electrons and holes injected from both ends are recombined is referred to as a light-emitting unit. Therefore, it can be said that the structure example 1 of the light-emitting element includes one light-emitting unit.

A light-emitting unit 1103 includes at least a light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties).

Figure 7B:
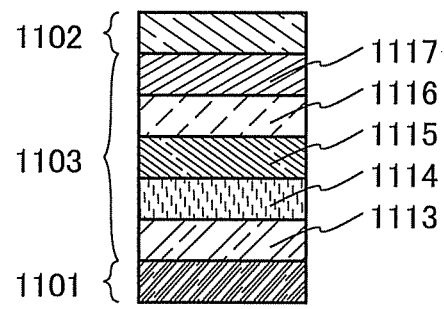

An example of a specific structure of the light-emitting unit 1103 is illustrated in FIG. 7B. In the light-emitting unit 1103 illustrated in FIG. 7B, a hole-injection layer 1113, a hole-transport layer 1114, a light-emitting layer 1115, an electron-transport layer 1116, and an electron-injection layer 1117 are stacked in that order from the anode 1101 side.

Structure Example 2 of Light-Emitting Element

Figure 7C:
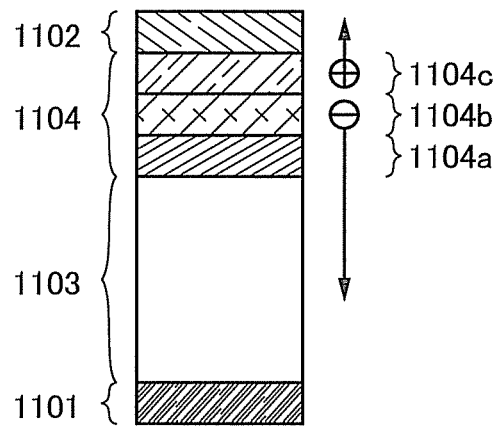

Another example of the structure of the light-emitting element is illustrated in FIG. 7C. In the light-emitting element illustrated in FIG. 7C, an EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit included in the structure example 1 of the light-emitting element, which is described above, can be applied to the light-emitting unit 1103 in the structure example 2 of the light-emitting element, and the description of the structure example 1 of the light-emitting element can be referred to for the details.

The intermediate layer 1104 includes at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in this order from the cathode 1102 side.

The behaviors of electrons and holes in the intermediate layer 1104 are described. When a voltage higher than the threshold voltage of the light-emitting element is applied between the anode 1101 and the cathode 1102, in the first charge generation region 1104c, holes and electrons are generated, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier against electron injection into the light-emitting unit 1103, so that the efficiency of the electron injection into the light-emitting unit 1103 can be improved. Thus, the electrons generated in the first charge generation region 1104c are injected into the LUMO level of the light-emitting unit 1103 through the electron-relay layer 1104b and the electron-injection buffer 1104a.

In addition, the electron-relay layer 1104b can prevent interaction in which the substance contained in the first charge generation region 1104c and the substance included in the electron-injection buffer 1104a react with each other at the interface therebetween to impair the functions of the electron-injection buffer 1104a and the first charge generation region 1104c.

The range of choices of materials that can be used for the cathode in the structure example 2 of the light-emitting element is wider than that of materials that can be used for the cathode in the structure example 1 of the light-emitting element. This is because a material having a relatively high work function can be used for the cathode in the structure example 2 as long as the cathode in the structure example 2 receives at least holes generated by the intermediate layer.

Structure Example 3 of Light-Emitting Element

Figure 7D:
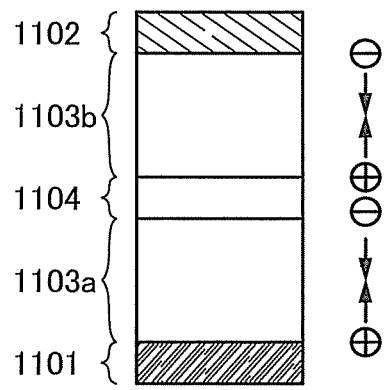
Figure 7E:
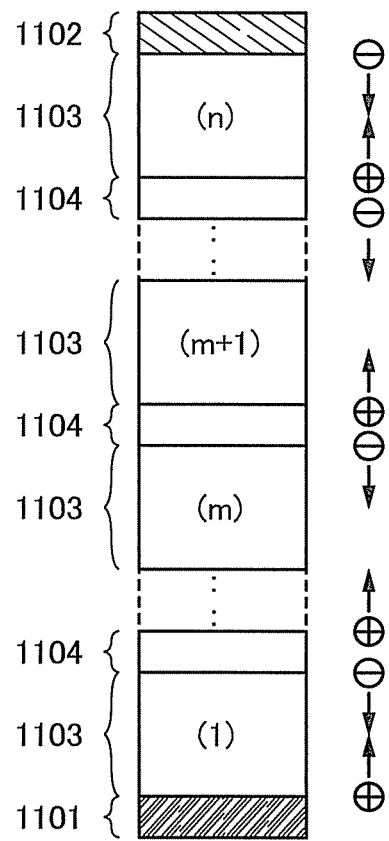

Another example of the structure of a light-emitting element is illustrated in FIG. 7D. In the light-emitting element illustrated in FIG. 7D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode and the cathode is not limited to two. A light-emitting element illustrated in FIG. 7E has a structure in which a plurality of light-emitting units 1103 is stacked, that is, a so-called tandem structure. Note that in the case where n (n is a natural number greater than or equal to 2) light-emitting units 1103 are provided between the anode and the cathode, the intermediate layer 1104 is provided between an m-th (m is a natural number greater than or equal to 1 and less than or equal to n−1) light-emitting unit and an (m+1)-th light-emitting unit.

Note that a structure similar to that in the structure example 1 of the light-emitting element can be applied to the light-emitting unit 1103 in the structure example 3 of the light-emitting element; a structure similar to that in the structure example 2 of the light-emitting element can be applied to the intermediate layer 1104 in the structure example 3 of the light-emitting element. Thus, for the details, the description of the structure example 1 of the light-emitting element or the structure example 2 of the light-emitting element can be referred to.

The behaviors of electrons and holes in the intermediate layer 1104 provided between the light-emitting units are described. When a voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween. Specifically, when one surface of the light-emitting unit is provided with a charge generation region, the charge generation region functions as a first charge generation region of the intermediate layer; thus, the light-emitting units can be provided in contact with each other.

The structure examples 1 to 3 of the light-emitting element can be implemented in combination. For example, an intermediate layer may be provided between the cathode and the light-emitting unit in the structure example 3 of the light-emitting element.
(Material for Light-Emitting Element)

Next, specific materials that can be used for the light-emitting elements having the above structures are described; materials for the anode, the cathode, and the EL layer are described in this order.
(Material for Anode)

The anode 1101 is formed using a single layer or a stack containing a material with conductivity, for example, a metal, an alloy, or an electrically conductive compound, or a mixture thereof. In particular, a structure in which a material having a high work function (specifically, 4.0 eV or more) is in contact with an EL layer is preferable.

Examples of the metal and alloy include metal materials such as gold (Au), platinum (Pt), nickel (Ni), tungsten (W), chromium (Cr), molybdenum (Mo), iron (Fe), cobalt (Co), copper (Cu), palladium (Pd), and titanium (Ti), and an alloy material containing any of these metals.

Examples of the electrically conductive compound include an oxide of a metal material, a nitride of a metal material, and a conductive high molecule.

Specific examples of the oxide of a metal material include indium tin oxide (ITO), indium tin oxide containing silicon or silicon oxide, indium tin oxide containing titanium, indium titanium oxide, indium tungsten oxide, indium zinc oxide, and indium zinc oxide containing tungsten. Further, the examples also include molybdenum oxide, vanadium oxide, ruthenium oxide, tungsten oxide, manganese oxide, and titanium oxide.

Such films containing oxides of metal materials are usually formed by a sputtering method, but may also be formed by application of a sol-gel method or the like. For example, an indium-zinc oxide film can be formed by a sputtering method using a target in which zinc oxide is added to indium oxide at greater than or equal to 1 wt % and less than or equal to 20 wt %. A film of indium oxide containing tungsten oxide and zinc oxide can be formed by a sputtering method using a target in which tungsten oxide and zinc oxide are added to indium oxide at greater than or equal to 0.5 wt % and less than or equal to 5 wt % and greater than or equal to 0.1 wt % and less than or equal to 1 wt %, respectively.

Specific examples of the nitride of a metal material include titanium nitride and tantalum nitride.

Specific examples of the conductive high molecule include poly(3,4-ethylenedioxythiophene)/poly(styrenesulfonic acid) (PEDOT/PSS) and polyaniline/poly(styrenesulfonic acid) (PAni/PSS).

Note that in the case where a second charge generation region is provided in contact with the anode 1101, a variety of conductive materials can be used for the anode 1101 regardless of their work functions. Specifically, besides a material which has a high work function, a material which has a low work function can also be used for the anode 1101. A material forming the second charge generation region is subsequently described together with a material for forming the first charge generation region.
(Material for Cathode)

In the case where the first charge generation region 1104c is provided between the cathode 1102 and the light-emitting unit 1103 to be in contact with the cathode 1102, a variety of conductive materials can be used for the cathode 1102 regardless of their work functions.

Note that at least one of the cathode 1102 and the anode 1101 is formed using a conductive film that transmits visible light. For example, when one of the cathode 1102 and the anode 1101 is formed using a conductive film that transmits visible light and the other is formed using a conductive film that reflects visible light, a light-emitting element that emits light from one side can be formed. Alternatively, when both the cathode 1102 and the anode 1101 are formed using conductive films that transmit visible light, a light-emitting element that emits light from both sides can be formed.

For the conductive film that transmits visible light, for example, indium tin oxide, indium tin oxide containing silicon or silicon oxide, indium tin oxide containing titanium, indium titanium oxide, indium tungsten oxide, indium zinc oxide, and indium zinc oxide containing tungsten can be used. Further, a metal thin film having such a thickness as to transmit light (preferably, approximately 5 nm to 30 nm) can also be used.

For the conductive film that reflects visible light, a metal is used, for example. Specific examples include metal materials such as silver, aluminum, platinum, gold, and copper, and an alloy material containing any of these metals. Examples of the alloy containing silver include a silver-neodymium alloy and a magnesium-silver alloy. Examples of the alloy containing aluminum include an aluminum-nickel-lanthanum alloy, an aluminum-titanium alloy, and an aluminum-neodymium alloy.

(Material for EL Layer)

Specific examples of materials for the layers included in the light-emitting unit 1103 are given below.

The hole-injection layer is a layer that contains a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesulfonic acid) (PEDOT/PSS), or the like to form the hole-injection layer.

Note that the hole-injection layer may be formed using the second charge generation region. When the second charge generation region is used for the hole-injection layer, a variety of conductive materials can be used for the anode 1101 regardless of their work functions as described above. A material for forming the second charge generation region is subsequently described together with a material for forming the first charge generation region.

(Hole-Transport Layer)

The hole-transport layer is a layer that contains a substance having a high hole-transport property. The hole-transport layer is not limited to a single layer, but may be a stack including two or more layers each containing a substance having a high hole-transport property. The hole-transport layer contains any substance having a higher hole-transport property than an electron-transport property, and preferably contains a substance having a hole mobility of $10^{-6}$ $cm^2/V \cdot s$ or higher because the drive voltage of the light-emitting element can be reduced.

Examples of the substance having a high hole-transport property include an aromatic amine compound (e.g., 4,4'-bis[N-(1-naphthyl)-N-phenylamino]biphenyl (abbreviation: NPB or α-NPD)), and a carbazole derivative (e.g., 9-[4-(10-phenyl-9-anthracenyl)phenyl]-9H-carbazole (abbreviation: CzPA)). Moreover, a high molecular compound (e.g., poly(N-vinylcarbazole) (abbreviation: PVK)) can also be used.

(Light-Emitting Layer)

The light-emitting layer contains a light-emitting substance. The light-emitting layer is not limited to a single layer, but may be a stack including two or more layers each containing a light-emitting substance. As the light-emitting substance, a fluorescent compound or a phosphorescent compound can be used. A phosphorescent compound is preferably used as the light-emitting substance because the emission efficiency of the light-emitting element can be increased.

A fluorescent compound (e.g., coumarin 545T) or a phosphorescent compound (e.g., tris(2-phenylpyridinato)iridium(III) (abbreviation: $Ir(ppy)_3$)) can be used as the light-emitting substance.

The light-emitting substance is preferably dispersed in a host material. A host material preferably has higher excitation energy than the light-emitting substance.

As the host material, for example, the following can be used: the above-described substance having a high hole-transport property (e.g., an aromatic amine compound, a carbazole derivative, or a high molecular compound) and a later-described substance having a high electron-transport property (e.g., a metal complex having a quinoline skeleton or a benzoquinoline skeleton or a metal complex having an oxazole-based or thiazole-based ligand).

(Electron-Transport Layer)

The electron-transport layer is a layer that contains a substance having a high electron-transport property. The electron-transport layer is not limited to a single layer, but may be a stack including two or more layers each containing a substance having a high electron-transport property. The electron-transport layer contains any substance having a higher electron-transport property than a hole-transport property, and preferably contains a substance having an electron mobility of $10^{-6}$ $cm^2/V \cdot s$ or higher because the drive voltage of the light-emitting element can be reduced.

As the substance having a high electron-transport property, a metal complex having a quinoline skeleton or a benzoquinoline skeleton (e.g., tris(8-quinolinolato)aluminum (abbreviation: Alq)), a metal complex having an oxazole-based or thiazole-based ligand (e.g., bis[2-(2-hydroxyphenyl)benzoxazolato]zinc (abbreviation: $Zn(BOX)_2$)), another compound (e.g., bathophenanthroline (abbreviation: BPhen)), or the like can be used. Further, a high molecular compound (e.g., poly[(9,9-dihexylfluorene-2,7-diyl)-co-(pyridine-3,5-diyl)] (abbreviation: PF-Py)) or the like can be used.

(Electron-Injection Layer)

The electron-injection layer is a layer that contains a substance having a high electron-injection property. The electron-injection layer is not limited to a single layer, but may be a stack including two or more layers each containing a substance having a high electron-injection property. The electron-injection layer is preferably provided because the efficiency of electron injection from the cathode 1102 can be increased and the drive voltage of the light-emitting element can be reduced.

Examples of the substance having a high electron-injection property include an alkali metal (e.g., lithium (Li) or cesium (Cs)), an alkaline earth metal (e.g., calcium (Ca)), and a compound thereof (e.g., an oxide (specifically, lithium oxide or the like), a carbonate (specifically, lithium carbonate, a cesium carbonate, or the like), or a halide (specifically, lithium fluoride (LiF), cesium fluoride (CsF), calcium fluoride ($CaF_2$), or the like)).

Alternatively, it is possible to form the layer that contains a substance having a high electron-injection property by forming a layer that contains a substance having a high electron-transport property and a donor substance (specifically, an Alq (abbreviation) layer containing magnesium (Mg) or the like). Note that the donor substance is preferably added so that the mass ratio of the donor substance to the substance having a high electron-transport property is from 0.001:1 to 0.1:1.

As the donor substance, an organic compound such as tetrathianaphthacene (abbreviation: TTN), nickelocene, or decamethylnickelocene can be used as well as an alkali metal, an alkaline earth metal, a rare earth metal, and a compound thereof.

(Material for Charge Generation Region)

The first charge generation region 1104c and the second charge generation region are regions that contain a substance having a high hole-transport property and an acceptor substance. The charge generation region may not only contain a substance having a high hole-transport property and an acceptor substance in the same film but also include a stack of a layer that contains a substance having a high hole-transport property and a layer that contains an acceptor substance. Note that in a case of a layered structure in which the first charge generation region is provided on the cathode side, the layer that contains the substance having a high hole-transport property is in contact with the cathode 1102, and in a case of a layered structure in which the second charge generation region is provided on the anode side, the layer that contains the acceptor substance is in contact with the anode 1101.

Note that the acceptor substance is preferably added to the charge generation region so that the mass ratio of the acceptor substance to the substance having a high hole-transport property is from 0.1:1 to 4.0:1.

As the acceptor substance that is used for the charge generation region, a transition metal oxide or an oxide of a metal belonging to any of Groups 4 to 8 of the periodic table can be used. Specifically, molybdenum oxide is particularly preferable. Note that molybdenum oxide has a low hygroscopic property.

As the substance having a high hole-transport property, which is used for the charge production region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ cm$^2$/V·s or higher is preferably used. However, other substances than the above described materials may also be used as long as the substances have higher hole-transport properties than electron-transport properties.

(Material for Electron-Relay Layer)

The electron-relay layer 1104b is a layer that can immediately accept electrons drawn out by the acceptor substance in the first charge generation region 1104c. Therefore, the electron-relay layer 1104b is a layer that contains a substance having a high electron-transport property, and the LUMO level of the electron-relay layer 1104b is positioned between the acceptor level of the acceptor substance in the first charge generation region 1104c and the LUMO level of the light-emitting unit 1103 that is in contact with the electron-relay layer. Specifically, the LUMO level of the electron-relay layer 1104b is preferably about from −5.0 eV to −3.0 eV.

Examples of a substance used for the electron-relay layer 1104b include a perylene derivative (e.g., 3,4,9,10-perylene-tetracarboxylic dianhydride (abbreviation: PTCDA)) and a nitrogen-containing condensed aromatic compound (e.g., pirazino[2,3-f][1,10]phenanthroline-2,3-dicarbonitrile (abbreviation: PPDN)).

Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used because such a compound further facilitates acceptance of electrons in the electron-relay layer 1104b.

(Material for Electron-Injection Buffer)

The electron-injection buffer is a layer that contains a substance having a high electron-injection property. The electron-injection buffer 1104a is a layer which facilitates electron injection from the first charge generation region 1104c into the light-emitting unit 1103. By providing the electron-injection buffer 1104a between the first charge generation region 1104c and the light-emitting unit 1103, the injection barrier therebetween can be reduced.

Examples of the substance having a high electron-injection property include an alkali metal, an alkaline earth metal, a rare earth metal, and a compound thereof.

Alternatively, a layer that contains the substance having a high electron-injection property may be formed using a layer that contains a substance having a high electron-transport property and a donor substance.

(Method for Manufacturing Light-Emitting Element)

A method for manufacturing the light-emitting element is described. Over the first electrode, the layers described above are combined as appropriate to form an EL layer. Any of a variety of methods (e.g., a dry process or a wet process) can be used for forming the EL layer depending on the material for the EL layer. For example, a vacuum evaporation method, a transfer method, a printing method, an inkjet method, a spin coating method, or the like may be selected. Note that a different method may be employed for each layer. The second electrode is formed over the EL layer. Thus, the light-emitting element is manufactured.

The light-emitting element described in this embodiment can be manufactured by combination of the above-described materials. Light emission from the above-described light-emitting substance can be obtained with this light-emitting element, and the emission color can be selected by changing types of the light-emitting substance.

Further, a plurality of light-emitting substances which emit light of different colors can be used, whereby, for example, white light emission can also be obtained by expanding the width of the emission spectrum. In order to obtain white light emission, for example, a structure may be employed in which at least two layers containing light-emitting substances are provided so that light of complementary colors is emitted. Specific examples of complementary colors include "blue and yellow" and "blue-green and red".

Further, in order to obtain white light emission with an excellent color rendering property, an emission spectrum preferably expands in the entire visible light region. For example, a light-emitting element may include layers emitting light of blue, green, and red.

This embodiment can be combined with any of the other embodiments in this specification as appropriate.

Embodiment 6

This embodiment shows electronic appliances according to embodiments of the present invention. Specifically, electronic appliances each including a light-emitting panel according to one embodiment of the present invention are described with reference to FIGS. 8A to 8F.

Examples of the electronic appliances to which the light-emitting device is applied are television devices (also referred to as TV or television receivers), monitors for computers and the like, cameras such as digital cameras and digital video cameras, digital photo frames, cellular phones (also referred to as mobile phones or portable telephone devices), portable game machines, portable information terminals, audio playback devices, large game machines such as pachinko machines, and the like. Specific examples of these electronic appliances are shown in FIGS. 8A to 8F.

Figure 8A:
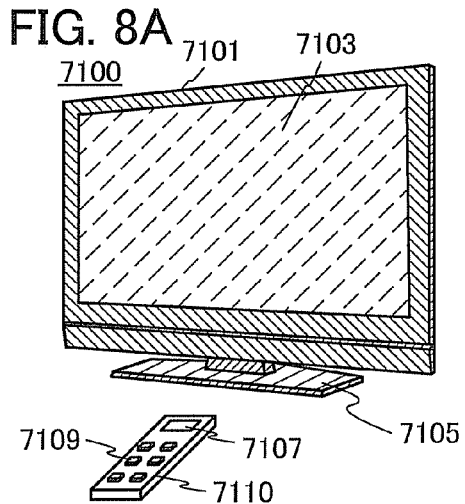
FIGS. 8A to 8F each illustrate an electronic appliance including light-emitting module according to one embodiment.

FIG. 8A illustrates an example of a television set. In a television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, general television broadcast can be received. Moreover, when the display device is connected to a communication network with or without wires via the modem, one-way (from a sender to a receiver) or two-way (between a sender and a receiver or between receivers) information communication can be performed.

Figure 8B:
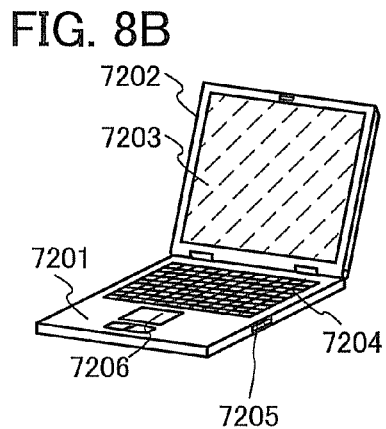

FIG. 8B illustrates a computer, which includes a main body 7201, a housing 7202, a display portion 7203, a keyboard 7204, an external connection port 7205, a pointing device 7206, and the like. This computer is manufactured by using a light-emitting device for the display portion 7203.

Figure 8C:
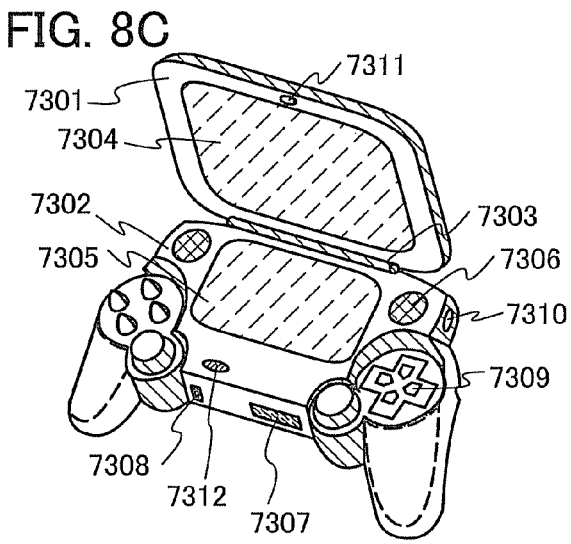

FIG. 8C illustrates a portable game machine, which includes two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. The portable game machine in FIG. 8C also includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), and a microphone 7312), and the like. It is needless to say that a structure of the portable game machine is not limited to the above as long as the light-emitting device is used for at least either the display portion 7304 or the display portion 7305, or both, and may include other accessories as appropriate. The portable game machine in FIG. 8C has a function of reading a program or data stored in a recording medium to display it on the display portion, and a function of sharing information with another portable game machine by wireless communication. The portable game machine in FIG. 8C can have a variety of functions without limitation to the above functions.

Figure 8D:
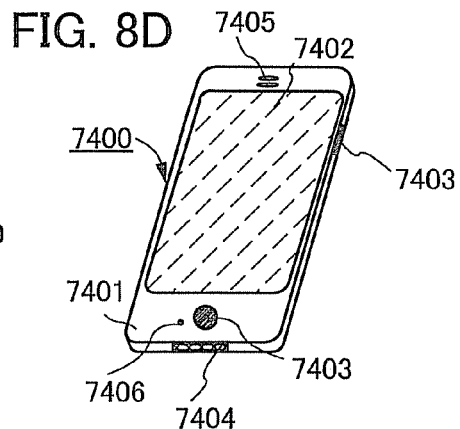

FIG. 8D illustrates an example of a cellular phone. A cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using a light-emitting device for the display portion 7402.

When the display portion 7402 of the cellular phone 7400 illustrated in FIG. 8D is touched with a finger or the like, data can be input into the cellular phone 7400. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or creating e-mail, a text input mode mainly for inputting text is selected for the display portion 7402 so that text displayed on a screen can be input. In this case, it is preferable to display a keyboard or number buttons on almost all the area of the screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 8E:
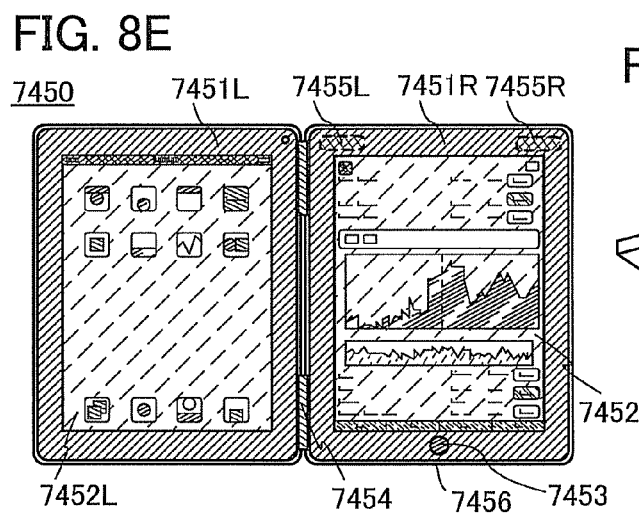

FIG. 8E illustrates an example of a folding computer. A folding computer 7450 includes a housing 7451L and a housing 7451R connected by hinges 7454. The folding computer 7450 further includes an operation button 7453, a left speaker 7455L, and a right speaker 7455R. In addition, a side surface of the folding computer 7450 is provided with an external connection port 7456, which is not illustrated. Note that when the folding computer is folded on the hinges 7454 so that a display portion 7452L provided in the housing 7451L and a display portion 7452R provided in the housing 7451R can face each other, the display portions can be protected by the housings.

Each of the display portions 7452L and 7452R is a component which can display images and to which information can be input by touch with a finger or the like. For example, the icon for the installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables information input.

Further, the computer 7450 can also include a gyroscope, an acceleration sensor, a global positioning system (GPS) receiver, a fingerprint sensor, or a video camera. For example, a detection device including a sensor which detects inclination, such as a gyroscope or an acceleration sensor, is provided to determine the orientation of the computer 7450 (whether the computer is placed horizontally or vertically for a landscape mode or a portrait mode) so that the orientation of the display screen can be automatically changed.

Furthermore, the computer 7450 can be connected to a network. The computer 7450 not only can display information on the Internet but also can be used as a terminal which controls another electronic appliance connected to the network from a distant place.

Figure 8F:
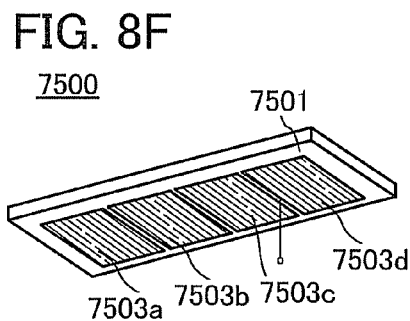

FIG. 8F illustrates an example of a lighting device. In a lighting device 7500, light-emitting devices 7503a to 7503d according to embodiments of the present invention are incorporated in a housing 7501 as light sources. The lighting device 7500 can be attached to a ceiling, a wall, or the like.

The light-emitting device according to one embodiment of the present invention includes a light-emitting panel in a thin film form. Thus, when the light-emitting device is attached to a base with a curved surface, the light-emitting device with a curved surface can be obtained. In addition, when the light-emitting device is located in a housing with a curved surface, an electronic appliance or a lighting device with a curved surface can be obtained.

This embodiment can be combined with any of the other embodiments in this specification as appropriate.

This application is based on Japanese Patent Application Serial No. 2011-242293 filed with Japan Patent Office on Nov. 4, 2011, the entire contents of which are hereby incorporated by reference.

What is claimed is:

1. A light-emitting module comprising:
   a first substrate;
   a first electrode over the first substrate;
   a second electrode over the first substrate;
   a first layer containing a light-emitting organic compound between the first electrode and the second electrode;
   a partition over the first electrode;
   a second substrate over the first substrate; and
   a conductive spacer maintaining a gap between the first substrate and the second substrate,
   wherein the conductive spacer is electrically connected to the second electrode in a position overlapping with the partition, and
   wherein the conductive spacer comprises an edge in which a corner portion is chamfered to have a curved surface.

2. The light-emitting module according to claim 1,
   wherein the conductive spacer provided over the second substrate.

3. The light-emitting module according to claim 1, further comprising a space between the first substrate and the second substrate,
   wherein a pressure in the space is lower than or equal to an atmospheric pressure.

4. The light-emitting module according to claim 1, further comprising:
   a second layer containing a light-emitting organic compound between the first electrode and the second electrode; and
   an intermediate layer between the first layer and the second layer,
   wherein the intermediate layer contains an electron-transport substance and a donor substance.

5. The light-emitting module according to claim 1,
   wherein the edge is electrically connected to the second electrode.

6. The light-emitting module according to claim 1,
   wherein the conductive spacer has a stripe shape, a vein shape, a lattice shape, or a mesh shape.

7. The light-emitting module according to claim 1,
   wherein the conductive spacer has a layered structure in which a titanium film is provided over an aluminum film.

8. The light-emitting module according to claim 1,
   wherein the conductive spacer includes at least one of aluminum, copper, chromium, tantalum, titanium, molybdenum, and tungsten.

9. The light-emitting module according to claim 1,
   wherein the conductive spacer comprises a plurality of layers, and
   wherein a layer with a lower reflectance than another layer in the conductive spacer is provided on a second substrate side.

10. The light-emitting module according to claim 9,
    wherein the layer with the lower reflectance is a colored conductive layer or a colored insulating layer.

11. The light-emitting module according to claim 1, further comprising a color filter that extends between the second substrate and the conductive spacer.

12. A light-emitting device comprising the light-emitting module according to claim 1.

13. A light-emitting module comprising:
    a first substrate;
    a first electrode over the first substrate;
    a second electrode over the first substrate;
    a first layer containing a light-emitting organic compound between the first electrode and the second electrode;
    a partition over the first electrode;
    a second substrate over the first substrate; and
    a conductive spacer between the second electrode and the partition, the conductive spacer maintaining a gap between the first substrate and the second substrate,
    wherein the conductive spacer is electrically connected to the second electrode in a position overlapping with the partition.

14. The light-emitting module according to claim 13, further comprising a space between the first substrate and the second substrate,
    wherein a pressure in the space is lower than or equal to an atmospheric pressure.

15. The light-emitting module according to claim 13, further comprising:
    a second layer containing a light-emitting organic compound between the first electrode and the second electrode; and
    an intermediate layer between the first layer and the second layer,
    wherein the intermediate layer contains an electron-transport substance and a donor substance.

16. The light-emitting module according to claim 13, further comprising a color filter that extends between the second substrate and the conductive spacer.

17. The light-emitting module according to claim 13,
    wherein the conductive spacer has a stripe shape, a vein shape, a lattice shape, or a mesh shape.

18. The light-emitting module according to claim 13,
    wherein the conductive spacer has a layered structure in which a titanium film is provided over an aluminum film.

19. The light-emitting module according to claim 13,
    wherein the conductive spacer include at least one of aluminum, copper, chromium, tantalum, titanium, molybdenum, and tungsten.

20. A light-emitting device comprising the light-emitting module according to claim 13.

* * * * *

UNITED STATES PATENT AND TRADEMARK OFFICE
CERTIFICATE OF CORRECTION

PATENT NO.       : 8,890,127 B2
APPLICATION NO.  : 13/664864
DATED            : November 18, 2014
INVENTOR(S)      : Shunpei Yamazaki et al.

It is certified that error appears in the above-identified patent and that said Letters Patent is hereby corrected as shown below:

In the Specification:

Column 5, Line 53; Change "light-emitting, panel" to --light-emitting panel--.

Column 5, Line 61; Change "including light-emitting" to --including a light-emitting--.

Column 6, Line 16; Change "element, formed" to --element formed--.

Column 7, Line 33; Change "element no" to --element 110--.

Column 9, Line 28; Change "fainted" to --formed--.

Column 30, Line 36; Change "faulted" to --formed--.

Column 34, Lines 34 to 35; Change "material forming" to --material for forming--.

Signed and Sealed this
Nineteenth Day of May, 2015

Michelle K. Lee
*Director of the United States Patent and Trademark Office*